US008767445B2

(12) United States Patent
Chellappa et al.

(10) Patent No.: US 8,767,445 B2
(45) Date of Patent: Jul. 1, 2014

(54) SRAM CIRCUITS FOR CIRCUIT IDENTIFICATION USING A DIGITAL FINGERPRINT

(75) Inventors: Srivatsan Chellappa, Tempe, AZ (US); Lawrence T. Clark, Phoenix, AZ (US)

(73) Assignee: Arizona Board of Regents for and on behalf of Arizone State University, Scottsdale, AZ (US)

( * ) Notice: Subject to any disclaimer, the term of this patent is extended or adjusted under 35 U.S.C. 154(b) by 295 days.

(21) Appl. No.: 13/415,599

(22) Filed: Mar. 8, 2012

(65) Prior Publication Data

US 2012/0230087 A1     Sep. 13, 2012

Related U.S. Application Data

(60) Provisional application No. 61/450,265, filed on Mar. 8, 2011.

(51) Int. Cl.
*G11C 11/00*     (2006.01)

(52) U.S. Cl.
USPC ...................................... 365/154; 365/230.08

(58) Field of Classification Search
USPC ............................................ 365/154, 230.08
See application file for complete search history.

(56) References Cited

U.S. PATENT DOCUMENTS 6,738,294 B2    5/2004   Layman et al.
8,305,835 B2 *   11/2012   Schreiber et al. ........ 365/230.06

OTHER PUBLICATIONS

Kirovski, D. et al., "Enabling trusted software integrity," 10th International Conference on Architectural Support for Programming Languages and Operating Systems, Oct. 2002, pp. 108-120.
Lee, J. et al., "A technique to build a secret key in integrated circuits with identification and authentication applications," IEEE VLSI Circuit Symposium, Jun. 2004, pp. 176-179.
Unknown Author, "The keyed-hash message authentication code (HMAC)," Federal Information Processing Standards Publication 198, Mar. 6, 2002, 20 pages.
Holcomb, D. et al., "Power-up SRAM state as an identifying fingerprint and source of true random numbers," IEEE Transactions on Computers, vol. 58, No. 9, Sep. 2009, pp. 1198-1210.
Suh, G. et al., "Physical unclonable functions for device authentication and secret key generation," 44th ACM/IEEE Design Automation Conference, Jun. 4-8, 2007, pp. 9-14.
Majzoobi, M. et al., "Lightweight secure PUFs," IEEE/ACM International Conference on Computer-Aided Design, Nov. 2008, pp. 670-673.
Ignatenko, M. et al., "Estimating the secrecy-rate of physical unclonable functions with the context-tree weighting method," IEEE International Symposium on Information Theory, Seattle, WA, Jul. 9-14, 2006, pp. 499-503.

(Continued)

*Primary Examiner* — Son Dinh
*Assistant Examiner* — Nam Nguyen
(74) *Attorney, Agent, or Firm* — Withrow & Terranova, P.L.L.C.

(57) ABSTRACT

Circuitry that includes static random access memory (SRAM) access circuitry and a group of SRAM memory cells is disclosed. A digital fingerprint of the group of SRAM memory cells is determined by using the SRAM access circuitry to force at least a portion of the group of SRAM memory cells into a metastable state and then releasing the portion of the SRAM memory cells. Each SRAM memory cell that was released then selects one of two stable states and the SRAM access circuitry provides a selection profile based on the selections. The digital fingerprint is based on the selection profile.

37 Claims, 14 Drawing Sheets

(56) References Cited

OTHER PUBLICATIONS

Alavi, M. et al., "A PROM element based on salicide agglomeration of poly fuses in a CMOS logic process," IEEE International Electron Devices Meeting, Dec. 1997, pp. 855-858.

Robson, N. et al., "Electronically programmable fuse (eFUSE): From memory redundancy to autonomic chips," IEEE Custom Integrated Circuits Conference, Sep. 2007, pp. 799-804.

Glidden, R. et al., "Design of ultra-low-cost UHF RFID tags for supply chain applications," IEEE Communications Magazine, vol. 42 No. 8, Aug. 2004, pp. 140-151.

Lofstrom, K. et al., "IC identification circuit using device mismatch," Proceedings of the IEEE International Solid State Circuits Conference, Feb. 2000, pp. 372-373.

Gassend, B. et al., "Delay-based circuit authentication and applications," Proceedings of the 2003 ACM Symposium on Applied Computers, Mar. 2003, pp. 294-301.

Su, Y. et al., "A digital 1.6 pJ/bit chip identification circuit using process variations," IEEE Journal of Solid-State Circuits, vol. 43 No. 1, Jan. 2008, pp. 69-77.

Seevinck, E. et al., "Static-noise margin analysis of MOS SRAM cells," IEEE Journal of Solid-State Circuits, vol. 22, No. 5, Oct. 1987, pp. 748-754.

Bhavnagarwala, A. et al., "The impact of intrinsic device fluctuations on CMOS SRAM cell stability," IEEE Journal of Solid-State Circuits, vol. 36, No. 4, Apr. 2001, pp. 658-665.

Chellappa, S. et al., "In-situ characterization and extraction of SRAM variability," Design Automation Conference, Jun. 2010, pp. 711-716.

Agarwal, K. et al., "Statistical analysis of SRAM cell stability," Design Automation Conference, Jul. 2006, pp. 57-62.

Yao, X. et al., "Design and Experimental Validation of Radiation Hardened by Design SRAM Cells," IEEE Transactions on Nuclear Science, vol. 57, No. 1, Part 2, Feb. 2010, pp. 258-265.

\* cited by examiner

SRAM CIRCUITS FOR CIRCUIT IDENTIFICATION USING A DIGITAL FINGERPRINT

RELATED APPLICATIONS

This application claims the benefit of U.S. provisional patent application No. 61/450,265, filed Mar. 8, 2011, the disclosure of which is incorporated herein by reference in its entirety.

FIELD OF THE DISCLOSURE

Embodiments of the present disclosure relate to static random access memory (SRAM) access circuitry and SRAM memory cells.

BACKGROUND

As computing devices are more interconnected, communication increasingly takes place on unreliable and sometimes hostile networks. Since the information transmitted on a channel is public and can be tampered with, ensuring the safety and authenticity of information becomes a prime objective in many sensitive commercial and defense applications. Encryption of data and verification of a digital signature of communicating devices are keys to ensuring this safe and reliable transfer of information. Thus a secret fingerprint or unique circuit identifier (ID) that cannot be replicated by an adversary are needed to establish the identity of all sender and recipient integrated circuits (ICs). Their degree of robustness determines the overall effectiveness of cryptographic algorithms such as a hash message authentication code (HMAC). Additional applications include device identification, such as serial numbers, to license software and track devices. The latter allows prevention of grey market remarking and tracking of failures and customer returned ICs.

Analogous to a human fingerprint, an IC fingerprint ID must be unique for each instance of logically identical devices and should remain constant with time. The ID should be algorithmically unpredictable; it should be repeatable under all process, temperature and voltage conditions; and the ID length should be sufficient to allow correct identification of each die. Consequently, the ID must be accessible, but also secret from the outside world. Such constraints necessitate that the ID be implemented in hardware circuits rather that in software, the latter being vulnerable to attacks by simple memory dump or programming. Thus, there is a need for such an ID.

SUMMARY

Embodiments of the present disclosure relate to circuitry, which includes static random access memory (SRAM) access circuitry and a group of SRAM memory cells. A digital fingerprint of the group of SRAM memory cells is determined by using the SRAM access circuitry to force at least a portion of the group of SRAM memory cells into a metastable state and then releasing the portion of the SRAM memory cells. Each SRAM memory cell that was released then selects one of two stable states and the SRAM access circuitry provides a selection profile based on the selections. The digital fingerprint is based on the selection profile.

In one embodiment of the circuitry, each of the group of SRAM memory cells is coupled to a corresponding wordline, a corresponding inverting bitline, and a corresponding non-inverting bitline. In normal operation, when the corresponding inverting bitline and the corresponding non-inverting bitline are driven, the corresponding inverting bitline is at a LOW logic level and the corresponding non-inverting bitline is at a HIGH logic level, the corresponding inverting bitline is at a HIGH logic level and the corresponding non-inverting bitline is at a LOW logic level, or the corresponding inverting bitline is at a HIGH logic level and the corresponding non-inverting bitline is at a HIGH logic level during a precharge state of a read operation.

However, the SRAM access circuitry can force one of the SRAM memory cells into a first metastable state by driving both bitlines and the wordline to the SRAM memory cell, such that both bitlines are at the LOW logic level and the wordline is at a HIGH logic level. Alternatively, the SRAM access circuitry can force one of the SRAM memory cells into a second metastable state by driving both bitlines and the wordline to the SRAM memory cell, such that both bitlines are at the HIGH logic level and a voltage of the wordline is above a voltage of an SRAM memory cell power supply, which provides power to the SRAM memory cells. Then, the SRAM access circuitry can release the SRAM memory cell by driving the wordline to a LOW logic level, thereby causing the SRAM memory cell to select one of two stable states. The selection may be predominantly based on an inherent process induced mismatch of the SRAM memory cell. Using the selections made due to mismatches of a significant number of SRAM memory cells may provide a selection profile of the SRAM memory cells that is essentially unique. As such, the selection profile may be used to create a digital fingerprint of the SRAM memory cells. In this regard, the digital fingerprint may be used as a unique identifier of circuitry, which includes the SRAM memory cells.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
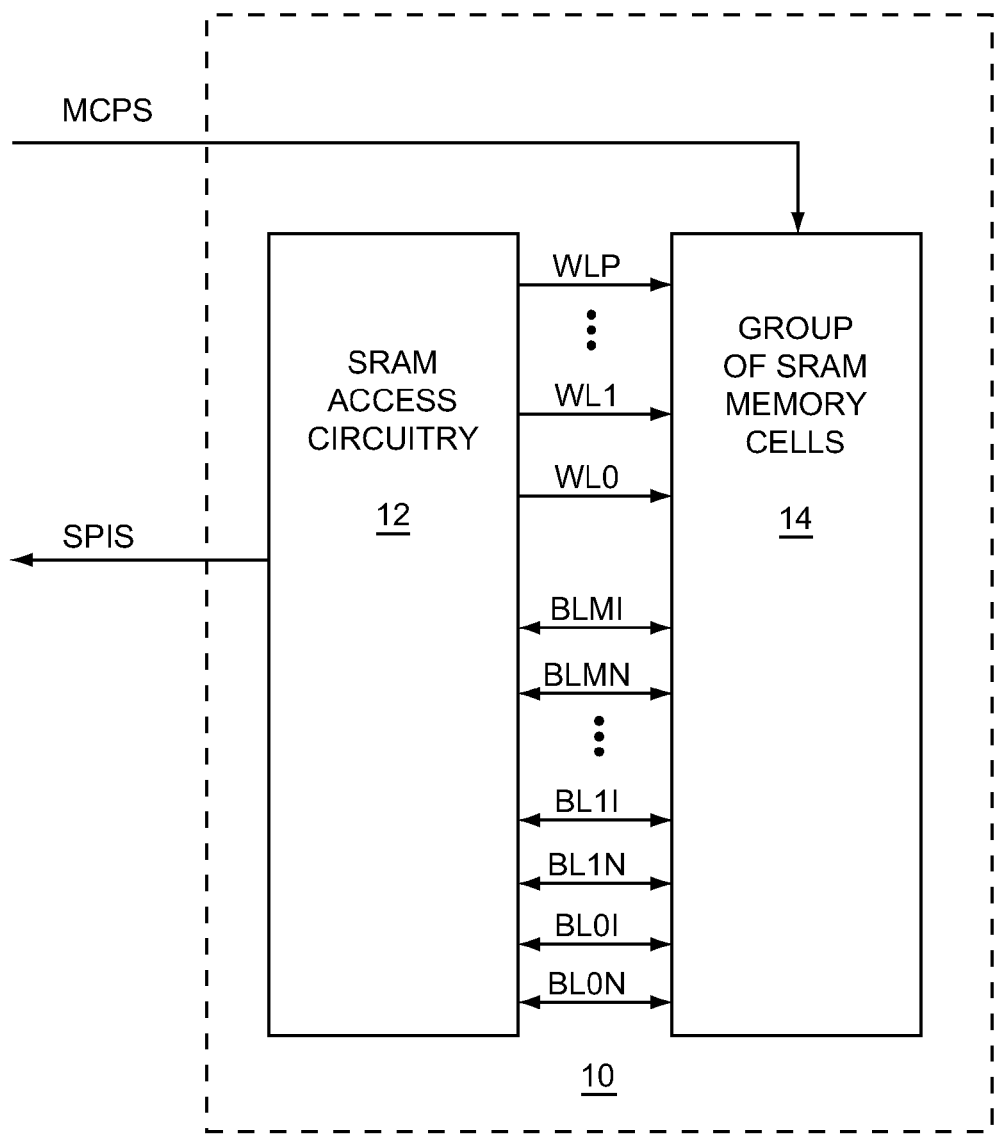
FIG. 1 shows circuitry according to one embodiment of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Unique hardware fingerprints that satisfy circuit identifier (ID) criteria can be extracted from bistable circuits, such as static random access memory (SRAM) cells. Since SRAM is ubiquitous in modern very large scale integration (VLSI) devices, this method takes advantage of a large number of available bits. SRAM fingerprints may be impossible to predict algorithmically as they are based on an inherent mismatch from CMOS manufacturing processes. Other methods for unique hardware ID generation for circuits, such as integrated circuits (ICs), are fingerprinting using data stored in non-volatile memories and using physically un-clonable functions based on physical variability of as-fabricated ICs, such as differential latch structures or timing changes.

One method of device authentication relies on programming a fingerprint or a digital signature in a nonvolatile memory block, which may include fuses, electrically erasable programmable read only memory (EEPROM), flash memory, the like, or any combination thereof. The unique signature assigned to the chip is programmed only once into the memory and is accessed whenever an application demands it. Though this method has the advantage that the fingerprint is not lost when the device is turned off, the cost of having a non-volatile memory both in terms of area and the extra processing steps required in manufacturing might outweigh the benefits. Moreover, data stored in a non-volatile memory, once known, may be cloned, thereby defeating its purpose.

Another method of generating unique fingerprints is to utilize the inherent process variations in devices to create physically un-clonable functions. Random variations affect certain properties of circuits and by constructing circuits sensitive to those properties, their difference in behavior can be utilized to identify different instances. Wire delays, transistor gate delays and changes in ring oscillator frequency are example circuit behavioral changes that may be utilized. Threshold voltage of transistors is also sensitive to process variations and may be directly dependent on random dopant fluctuations. Such variations may be random and thus ideally suited to create physically un-clonable functions.

Existing SRAM states obtained during IC power-up may be used as a fingerprint of a circuit. In this method the SRAM cell may be powered up numerous times to calculate a statistically repeatable known fingerprint and then used to authenticate any other fingerprints generated from further power-ups. Unfortunately, this scheme suffers from a number of drawbacks that include lack of support for designs with built in self test (BIST) and that the resulting non-matching codes have considerably less than ideal code separation. BIST is required in many designs to set redundancy at power-up, which means that the SRAM state will not be random when available to program or machine normal usage. The power-up SRAM cell state is influenced by process variations internal to the cell and external noise. As the cell is powered up, it operates in a sub-threshold region where it may be easily influenced by noise, thereby resulting in different power-up states. Further, the chip fingerprint can be generated only once while powering-up and not on demand.

Embodiments of the present disclosure relate to circuitry, which includes SRAM access circuitry and a group of SRAM memory cells. A digital fingerprint of the group of SRAM memory cells is determined by using the SRAM access circuitry to force at least a portion of the group of SRAM memory cells into a metastable state and then releasing the portion of the SRAM memory cells. Each SRAM memory cell that was released then selects one of two stable states and the SRAM access circuitry provides a selection profile based on the selections. The digital fingerprint is based on the selection profile.

In one embodiment of the circuitry, each of the group of SRAM memory cells is coupled to a corresponding wordline, a corresponding inverting bitline, and a corresponding non-inverting bitline. In normal operation, when the corresponding inverting bitline and the corresponding non-inverting bitline are driven, the corresponding inverting bitline is at a LOW logic level and the corresponding non-inverting bitline is at a HIGH logic level, the corresponding inverting bitline is at a HIGH logic level and the corresponding non-inverting bitline is at a LOW logic level, or the corresponding inverting bitline is at a HIGH logic level and the corresponding non-inverting bitline is at a HIGH logic level during a precharge state of a read operation.

However, the SRAM access circuitry can force one of the SRAM memory cells into a first metastable state by driving both bitlines and the wordline to the SRAM memory cell, such that both bitlines are at the LOW logic level and the wordline is at the HIGH logic level. Alternatively, the SRAM access circuitry can force one of the SRAM memory cells into a second metastable state by driving both bitlines and the wordline to the SRAM memory cell, such that both bitlines are at the HIGH logic level and a voltage of the wordline is above a voltage of an SRAM memory cell power supply, which provides power to the SRAM memory cells. In either the first metastable state or the second metastable state, the SRAM memory cell has a pair of de-stabilized sub-cells. Next, the SRAM access circuitry can release the SRAM memory cell by driving the wordline to a LOW logic level, thereby causing each of the pair of de-stabilized sub-cells to select one of two stable states.

The selection may be predominantly based on an inherent process induced mismatch of the SRAM memory cell. Using the selections made due to mismatches of a significant number of SRAM memory cells may provide a selection profile of the SRAM memory cells that is essentially unique. As such, the selection profile may be used to create a digital fingerprint of the SRAM memory cells. In this regard, the digital fingerprint may be used as a unique identifier of circuitry, which includes the SRAM memory cells.

In general, some embodiments of the present disclosure relate to using SRAM to exploit an as-fabricated device mismatch induced preferred state for extracting a reliable fingerprint. By forcing a metastable state, a selection profile may be obtained at all times and not just at IC power-up, thereby providing greater flexibility. Circuit modifications needed to support forcing a metastable state generally do not impact embedded SRAM operation or speed. The required SRAM array periphery circuit changes allow the use of standard foundry SRAM cells and do not impact the memory access time. Consequently, they can be integrated into any embedded memory, including high performance microprocessor caches. IC identification using un-clonable digital fingerprints may facilitate authentication of ICs, device tracking, cryptographic functions, or any combination thereof.

FIG. 1 shows circuitry 10 according to one embodiment of the present disclosure. The circuitry 10 includes SRAM access circuitry 12 and a group 14 of SRAM memory cells, such that the SRAM access circuitry 12 is coupled to the group 14 of SRAM memory cells. The group 14 of SRAM memory cells receives a memory cell power supply signal MCPS, which is fed to each of the group 14 of SRAM memory cells. The memory cell power supply signal MCPS provides power to each of the group 14 of SRAM memory cells and, in normal operation, enables each of the group 14 of SRAM memory cells to store one bit of information.

A $0^{th}$ non-inverting bitline BL0N, a $1^{st}$ non-inverting bitline BL1N, and up to and including an $M^{th}$ non-inverting bitline BLMN are coupled between the SRAM access circuitry 12 and the group 14 of SRAM memory cells. A $0^{th}$ inverting bitline BL0I, a $1^{st}$ inverting bitline BL1I, and up to and including an $M^{th}$ inverting bitline BLMI are coupled between the SRAM access circuitry 12 and the group 14 of SRAM memory cells. A $0^{th}$ wordline WL0, a $1^{st}$ wordline WL1, and up to and including a $P^{th}$ wordline WLP are coupled between the SRAM access circuitry 12 and the group 14 of SRAM memory cells. Each of the inverting bitlines BL0I, BL1I, BLMI is associated with a corresponding one of the non-inverting bitlines BL0N, BL1N, BLMN to form a pair of bitlines. For example, the $0^{th}$ inverting bitline BL0I and the $0^{th}$ non-inverting bitline BL0N form a $0^{th}$ pair of bitlines, the $1^{st}$ inverting bitline BL1I and the $1^{st}$ non-inverting bitline BL1N form a $1^{st}$ pair of bitlines, and so on.

In one embodiment of the group 14 of SRAM memory cells, the group 14 of SRAM memory cells are arranged as P+1 rows of the group 14 of SRAM memory cells, such that each row of the group 14 of SRAM memory cells has M+1 SRAM memory cells of the group 14 of SRAM memory cells. For each row, each of the M+1 SRAM memory cells is coupled to a corresponding one of the wordlines WL0, WL1, WLP. As such, each row of the group 14 of SRAM memory cells corresponds with one word of the group 14 of SRAM memory cells, such that each word is M+1 bits wide.

In one embodiment of the circuitry 10, the SRAM access circuitry 12 controls access to the group 14 of SRAM memory cells by driving the wordlines WL0, WL1, WLP. During an idle mode, the SRAM access circuitry 12 drives the wordlines WL0, WL1, WLP into a non-access state, such that data is not transferred on the bitlines BL0N, BL1N, BLMN, BL0I, BL1I, BLMI. During a normal word write operation, the SRAM access circuitry 12 drives one of the wordlines WL0, WL1, WLP into an access state and drives the bitlines BL0N, BL1N, BLMN, BL0I, BL1I, BLMI with data to be written into the group 14 of SRAM memory cells. Each bit of data is represented with one of the non-inverting bitlines BL0N, BL1N, BLMN and a corresponding one of the inverting bitlines BL0I, BL1I, BLMI. By driving the one of the wordlines WL0, WL1, WLP into the access state, the data is transferred from the bitlines BL0N, BL1N, BLMN, BL0I, BL1I, BLMI, thereby writing the word into a row of the group 14 of SRAM memory cells.

Figure 2:
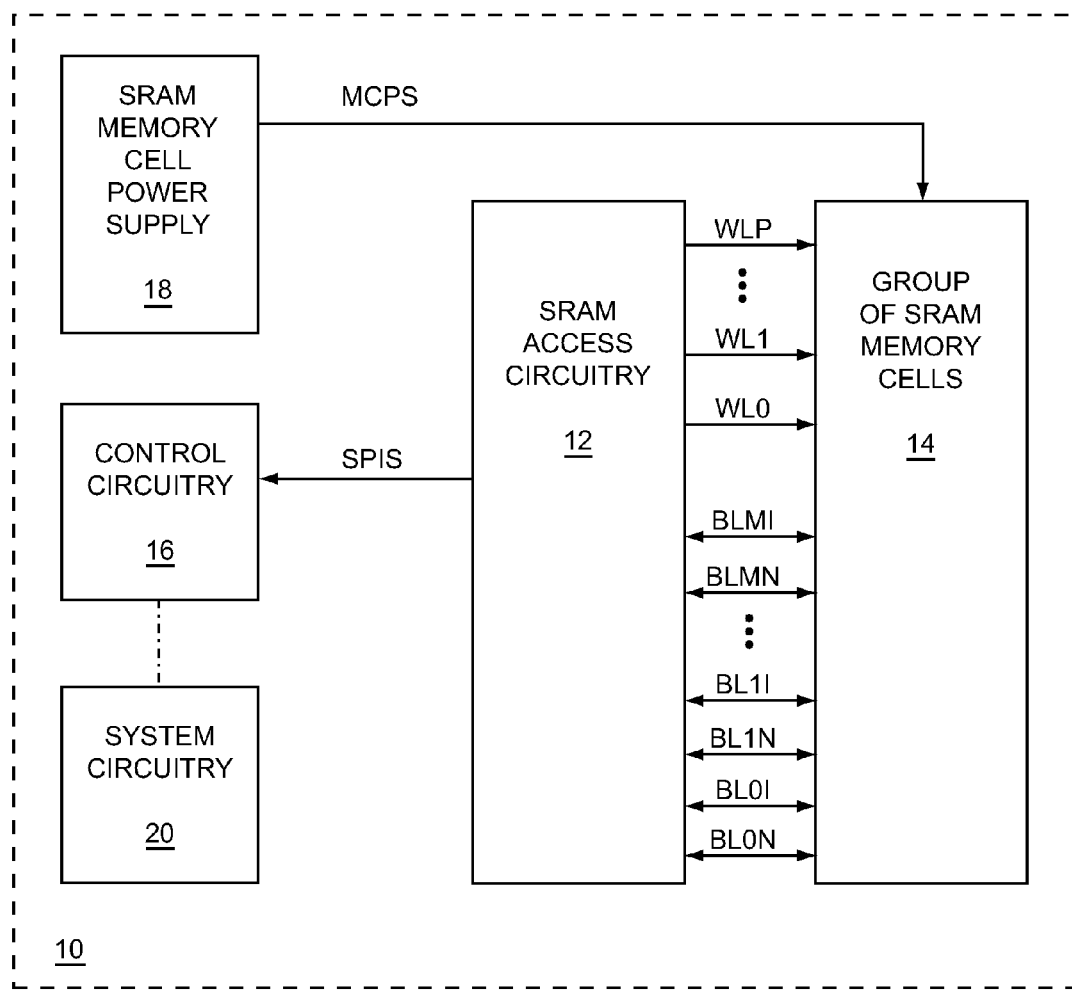
FIG. 2 shows the circuitry according to an alternate embodiment of the circuitry.

During a normal word read operation, the SRAM access circuitry 12 first drives the bitlines BL0N, BL1N, BLMN, BL0I, BL1I, BLMI into a precharge state, such that all of the bitlines BL0N, BL1N, BLMN, BL0I, BL1I, BLMI are at a HIGH logic level. Then, the SRAM access circuitry 12 stops driving the bitlines BL0N, BL1N, BLMN, BL0I, BL1I, BLMI and drives one of the wordlines WL0, WL1, WLP into the access state, thereby causing a row of the group 14 of SRAM memory cells associated with the one of the wordlines WL0, WL1, WLP to transfer data to the SRAM access circuitry 12 via the bitlines BL0N, BL1N, BLMN, BL0I, BL1I, BLMI by discharging one of the bitlines BL0N, BL1N, BLMN, BL0I, BL1I, BLMI low. After the normal word read operation and during the normal word write operation, one bitline in a pair of bitlines has a logic state that is opposite from another bitline in the pair of bitlines. For example, at the end of a normal word read operation or during a normal word write operation, either the $0^{th}$ inverting bitline BL0I is at a HIGH logic level and the $0^{th}$ non-inverting bitline BL0N is at a LOW logic level, or the $0^{th}$ inverting bitline BL0I is at the LOW logic level and the $0^{th}$ non-inverting bitline BL0N is at the HIGH logic level. Each of the group 14 of SRAM memory cells is designed so that a HIGH logic level on both one of the non-inverting bitlines BL0N, BL1N, BLMN and a corresponding one of the inverting bitlines BL0I, BL1I, BLMI will not de-stabilize the SRAM memory cell when the SRAM memory cell's corresponding wordline is driven to substantially the same voltage as a voltage of the memory cell power supply signal MCPS, which is provided by an SRAM memory cell power supply 18 (FIG. 2).

In one embodiment of the circuitry 10, a digital fingerprint of the group 14 of SRAM memory cells is determined by using the SRAM access circuitry 12 to force at least a portion of the group 14 of SRAM memory cells into a metastable state and then releasing the portion of the group 14 of SRAM memory cells. Each of the portion of the group 14 of SRAM memory cells then selects one of two stable states and the SRAM access circuitry 12 provides a selection profile based on the selections via a selection profile identification signal SPIS. The digital fingerprint is based on the selection profile. In one embodiment of the circuitry 10, the selection profile is substantially based on an inherent process induced mismatch of the portion of the group 14 of SRAM memory cells.

In one embodiment of the circuitry 10, the portion of the group 14 of SRAM memory cells is one row of the group 14 of SRAM memory cells. As such, each of the portion of the group 14 of SRAM memory cells is coupled to a corresponding one of the wordlines WL0, WL1, WLP, a corresponding one of the inverting bitlines BL0I, BL1I, BLMI, and a corresponding one of the group of non-inverting bitlines BL0N, BL1N, BLMN. In a normal write operation, when the corresponding one of the inverting bitlines BL0I, BL1I, BLMI and the corresponding one of the non-inverting bitlines BL0N, BL1N, BLMN are driven, either the corresponding one of the inverting bitlines BL0I, BL1I, BLMI is at the LOW logic level and the corresponding one of the non-inverting bitlines BL0N, BL1N, BLMN is at the HIGH logic level, or vice versa.

In a normal read operation, during a precharge state, the corresponding one of the inverting bitlines BL0I, BL1I, BLMI and the corresponding one of the non-inverting bitlines BL0N, BL1N, BLMN are driven by the SRAM access circuitry 12 to a HIGH logic level and the corresponding one of the wordlines WL0, WL1, WLP is driven by the SRAM access circuitry 12 to a LOW logic level. Then, the SRAM access circuitry 12 stops driving the one of the inverting bitlines BL0I, BL1I, BLMI and the corresponding one of the non-inverting bitlines BL0N, BL1N, BLMN. Next, the one of the wordlines WL0, WL1, WLP is driven by the SRAM access circuitry 12 to a HIGH logic level, thereby causing the corresponding one of the group 14 of SRAM memory cells to drive the corresponding one of the inverting bitlines BL0I, BL1I, BLMI and the corresponding one of the non-inverting bitlines BL0N, BL1N, BLMN. The SRAM access circuitry 12 then inputs the read data from the corresponding one of the inverting bitlines BL0I, BL1I, BLMI and the corresponding one of the non-inverting bitlines BL0N, BL1N, BLMN.

However, in one embodiment of the circuitry 10, the SRAM access circuitry 12 forces each of the portion of the group 14 of SRAM memory cells into the first metastable state by driving each corresponding one of the inverting bitlines BL0I, BL1I, BLMI, driving each corresponding one of the non-inverting bitlines BL0N, BL1N, BLMN, and driving the corresponding one of the wordlines WL0, WL1, WLP, such that each corresponding one of the inverting bitlines BL0I, BL1I, BLMI is at the LOW logic level, each corresponding one of the non-inverting bitlines BL0N, BL1N, BLMN is at the LOW logic level, and the corresponding one of the wordlines WL0, WL1, WLP is at the HIGH logic level. In this regard, the corresponding one of the wordlines WL0, WL1, WLP is at the HIGH logic level when the corresponding one of the wordlines WL0, WL1, WLP has about the same voltage as the voltage of the memory cell power supply signal MCPS.

Then SRAM access circuitry 12 then releases each of the portion of the group 14 of SRAM memory cells by driving the corresponding one of the wordlines WL0, WL1, WLP to a LOW logic state, thereby causing each of the portion of the group 14 of SRAM memory cells to select one of the two stable states. Basically, the wordline transition from the HIGH logic level to the LOW logic level isolates each SRAM memory cell, allowing it to move to its own preferred state as determined by the intrinsic imbalance caused by the mis-matches of its constituent transistors. As such, the selection may be substantially based on an inherent process induced mismatch of the portion of the group 14 of SRAM memory cells.

In one embodiment of the circuitry 10, the SRAM access circuitry 12 forces each of the portion of the group 14 of SRAM memory cells into the second metastable state by driving each corresponding one of the inverting bitlines BL0I, BL1I, BLMI, driving each corresponding one of the non-inverting bitlines BL0N, BL1N, BLMN, and driving the corresponding one of the wordlines WL0, WL1, WLP, such that each corresponding one of the inverting bitlines BL0I, BL1I, BLMI is at the HIGH logic level, each corresponding one of the non-inverting bitlines BL0N, BL1N, BLMN is at the HIGH logic level, and the corresponding one of the wordlines WL0, WL1, WLP has a voltage that is greater than the voltage of the memory cell power supply signal MCPS. Since driving the bitlines BL0N, BL1N, BLMN, BL0I, BL1I, BLMI to a voltage above the voltage of the memory cell power supply signal MCPS may create a DC current, when the one of the wordlines WL0, WL1, WLP has a voltage that is greater than the voltage of the memory cell power supply signal MCPS, the corresponding bitlines BL0N, BL1N, BLMN, BL0I, BL1I, BLMI may be driven to a voltage that is about equal to the voltage of the memory cell power supply signal MCPS. However, the corresponding bitlines BL0N, BL1N, BLMN, BL0I, BL1I, BLMI may function at higher voltages.

The SRAM access circuitry 12 then releases each of the portion of the group 14 of SRAM memory cells by driving the corresponding one of the wordlines WL0, WL1, WLP to a LOW logic state, thereby causing each of the portion of the group 14 of SRAM memory cells to select one of the two stable states. Basically, the wordline transitions from the voltage that is greater than the voltage of the memory cell power supply signal MCPS to the LOW logic level to isolate each SRAM memory cell, allowing it to move to its own preferred state as determined by the intrinsic imbalance caused by the mis-matches of its constituent transistors. As such, the selection may be substantially based on an inherent process induced mismatch of the portion of the group 14 of SRAM memory cells.

In a first exemplary embodiment of the circuitry 10, the voltage at each corresponding one of the wordlines WL0, WL1, WLP is equal to about 1.5 volts, the voltage of the memory cell power supply signal MCPS is equal to about 1.0 volts, the voltage at each corresponding one of the inverting bitlines BL0I, BL1I, BLMI is equal to about 1.0 volts, and the voltage at each corresponding one of the non-inverting bitlines BL0N, BL1N, BLMN is equal to about 1.0 volts. In a second exemplary embodiment of the circuitry 10, the voltage at each corresponding one of the wordlines WL0, WL1, WLP is equal to about 1.0 volts, the voltage of the memory cell power supply signal MCPS is equal to about 0.5 volts, the voltage at each corresponding one of the inverting bitlines BL0I, BL1I, BLMI is equal to about 0.5 volts, and the voltage at each corresponding one of the non-inverting bitlines BL0N, BL1N, BLMN is equal to about 0.5 volts.

In one embodiment of the circuitry 10, each corresponding one of the wordlines WL0, WL1, WLP is overdriven, such that a voltage at each corresponding one of the wordlines WL0, WL1, WLP is greater than the voltage of the memory cell power supply signal MCPS. Further, the voltage at each corresponding one of the wordlines WL0, WL1, WLP is greater when the SRAM access circuitry 12 forces each of the portion of the group 14 of SRAM memory cells into the second metastable state than when the corresponding one of the wordlines WL0, WL1, WLP has the HIGH logic level. The overdrive of the corresponding one of the wordlines WL0, WL1, WLP makes the strength of access transistors in each of the portion of the group 14 of SRAM memory cells too strong to maintain stability, allowing each SRAM memory cell into the metastable state.

In an alternate embodiment of the circuitry 10, the voltage of the memory cell power supply signal MCPS may be lowered when the SRAM access circuitry 12 forces each of the portion of the group 14 of SRAM memory cells into the second metastable state. The voltage at each corresponding one of the wordlines WL0, WL1, WLP is greater than the voltage of the memory cell power supply signal MCPS. However, the voltage at each corresponding one of the wordlines WL0, WL1, WLP is about the same when the SRAM access circuitry 12 forces each of the portion of the group 14 of SRAM memory cells into the second metastable state as when the corresponding one of the wordlines WL0, WL1, WLP has the HIGH logic level. The lowered voltage of the memory cell power supply signal MCPS may also be used as required to maintain oxide reliability.

Using the selections made due to mismatches of a significant number of the group 14 of SRAM memory cells may provide a selection profile of the group 14 of SRAM memory cells that is fairly unique. As such, the selection profile may be used to create a digital fingerprint of the group 14 of SRAM memory cells. In this regard, the digital fingerprint of the group 14 of SRAM memory cells may be an un-clonable digital fingerprint of the group 14 of SRAM memory cells. Further, the digital fingerprint may be used as a unique identifier of the circuitry 10, which includes the group 14 of SRAM memory cells. As such, the digital fingerprint may be used to authenticate the circuitry 10. In one embodiment of the circuitry 10, the circuitry 10 is an IC.

In an additional embodiment of the circuitry 10, a digital fingerprint of the group 14 of SRAM memory cells is determined by using the SRAM access circuitry 12 to force at least a portion of the group 14 of SRAM memory cells into a metastable state and then releasing the portion of the group 14 of SRAM memory cells. Each of the portion of the group 14 of SRAM memory cells then selects one of two stable states and the SRAM access circuitry 12 provides a selection profile based on the selections via a selection profile identification signal SPIS. Next, the SRAM access circuitry 12 is used to force at least the portion of the group 14 of SRAM memory cells into an opposite metastable state and then releasing the portion of the group 14 of SRAM memory cells. Each of the portion of the group 14 of SRAM memory cells then selects one of two stable states and the SRAM access circuitry 12 provides a supplemental selection profile based on the selections via a selection profile identification signal SPIS. The digital fingerprint is based on the selection profile and the supplemental selection profile. The SRAM memory cell power supply 18 (FIG. 2), which provides the memory cell power supply signal MCPS, is distinct from a VDD power supply (not shown), which provides power to the SRAM access circuitry 12. The VDD power supply may be derived from off-chip, or from an on-die regulation means well understood to most designers.

If, during the metastable state, each corresponding one of the inverting bitlines BL0I, BL1I, BLMI is at the LOW logic level and each corresponding one of the non-inverting bitlines BL0N, BL1N, BLMN is at the LOW logic level, then during the opposite metastable state, each corresponding one of the inverting bitlines BL0I, BL1I, BLMI is at the HIGH logic level, each corresponding one of the non-inverting bitlines BL0N, BL1N, BLMN is at the HIGH logic level, and the corresponding one of the wordlines WL0, WL1, WLP has a voltage that is greater than the voltage of the memory cell power supply signal MCPS. Conversely, if, during the metastable state, each corresponding one of the inverting bitlines BL0I, BL1I, BLMI is at the HIGH logic level, each corresponding one of the non-inverting bitlines BL0N, BL1N, BLMN is at the HIGH logic level, and the corresponding one of the wordlines WL0, WL1, WLP has a voltage that is greater than the voltage of the memory cell power supply signal MCPS, then during the opposite metastable state, each corresponding one of the inverting bitlines BL0I, BL1I, BLMI is at the LOW logic level and each corresponding one of the non-inverting bitlines BL0N, BL1N, BLMN is at the LOW logic level.

In general, in one embodiment of the circuitry 10, the circuitry 10 includes the group 14 of SRAM memory cells and the SRAM access circuitry 12. The SRAM access circuitry 12 forces at least a portion of the group 14 of SRAM memory cells into a metastable state. Then, the circuitry 10 determines a digital fingerprint of the group 14 of SRAM memory cells based on a release of the portion of the group 14 of SRAM memory cells from the metastable state.

In a first specific embodiment of the circuitry 10, the SRAM access circuitry 12 forces at least the portion of the group 14 of SRAM memory cells into the metastable state by driving a group of the inverting bitlines BL0I, BL1I, BLMI, such that each of the group of inverting bitlines BL0I, BL1I, BLMI is at a HIGH logic level; by driving a group of the non-inverting bitlines BL0N, BL1N, BLMN, such that each of the group of inverting bitlines BL0I, BL1I, BLMI is at a HIGH logic level; and driving a wordline into an asserted state, such that a voltage at the wordline is greater than a voltage of an SRAM memory cell power supply 18. Further, the circuitry 10 then determines the digital fingerprint of the group 14 of SRAM memory cells by releasing the portion of the group 14 of SRAM memory cells based on driving the wordline into a de-asserted state, such that the wordline has a LOW logic level; and then performing a normal read of the portion of the group 14 of SRAM memory cells, such that the digital fingerprint is based on the normal read.

In general, in an alternate embodiment of the circuitry 10, the circuitry 10 includes the group 14 of SRAM memory cells and the SRAM access circuitry 12. The SRAM access circuitry 12 forces at least a portion of the group 14 of SRAM memory cells into a metastable state. Then, the circuitry 10 determines a digital fingerprint of the group 14 of SRAM memory cells based on a release of the portion of the group 14 of SRAM memory cells from the metastable state. The SRAM access circuitry 12 then forces at least some of the portion of the group 14 of SRAM memory cells into an opposite metastable state. Finally, the circuitry 10 further determines the digital fingerprint of the group 14 of SRAM memory cells based on a release of the some of the portion of the group 14 of SRAM memory cells from the opposite metastable state.

Further, in one embodiment of the circuitry 10, determining the some of the portion of the group 14 SRAM memory cells is based on which of the portion of the group 14 of SRAM memory cells do not reliably obtain one state with one method. Additionally, in one embodiment of the circuitry 10, a masked digital fingerprint is based on inverting about one-half of the bits of the digital fingerprint. The about one-half of the bits of the digital fingerprint may be selected randomly.

FIG. 2 shows the circuitry 10 according to an alternate embodiment of the circuitry 10. The circuitry 10 illustrated in FIG. 2 is similar to the circuitry 10 illustrated in FIG. 1 except the circuitry 10 illustrated in FIG. 2 further includes control circuitry 16, the SRAM memory cell power supply 18, and system circuitry 20. The control circuitry 16 receives the selection profile identification signal SPIS from the SRAM access circuitry 12. As such, the SRAM access circuitry 12 provides the selection profile to the control circuitry 16 via the selection profile identification signal SPIS.

The control circuitry 16 may use the selection profile to create the digital fingerprint of the group 14 of SRAM memory cells. The digital fingerprint may be used as a unique identifier of the control circuitry 16, the system circuitry 20, or both. Further, the digital fingerprint may be used to authenticate the control circuitry 16, the system circuitry 20, or both. The SRAM memory cell power supply 18 provides the memory cell power supply signal MCPS. The SRAM memory cell power supply 18 is independent of the VDD power supply (not shown). In an alternate embodiment of the circuitry 10, any or all of the control circuitry 16, the SRAM memory cell power supply 18, and the system circuitry 20 are omitted.

Figure 3:
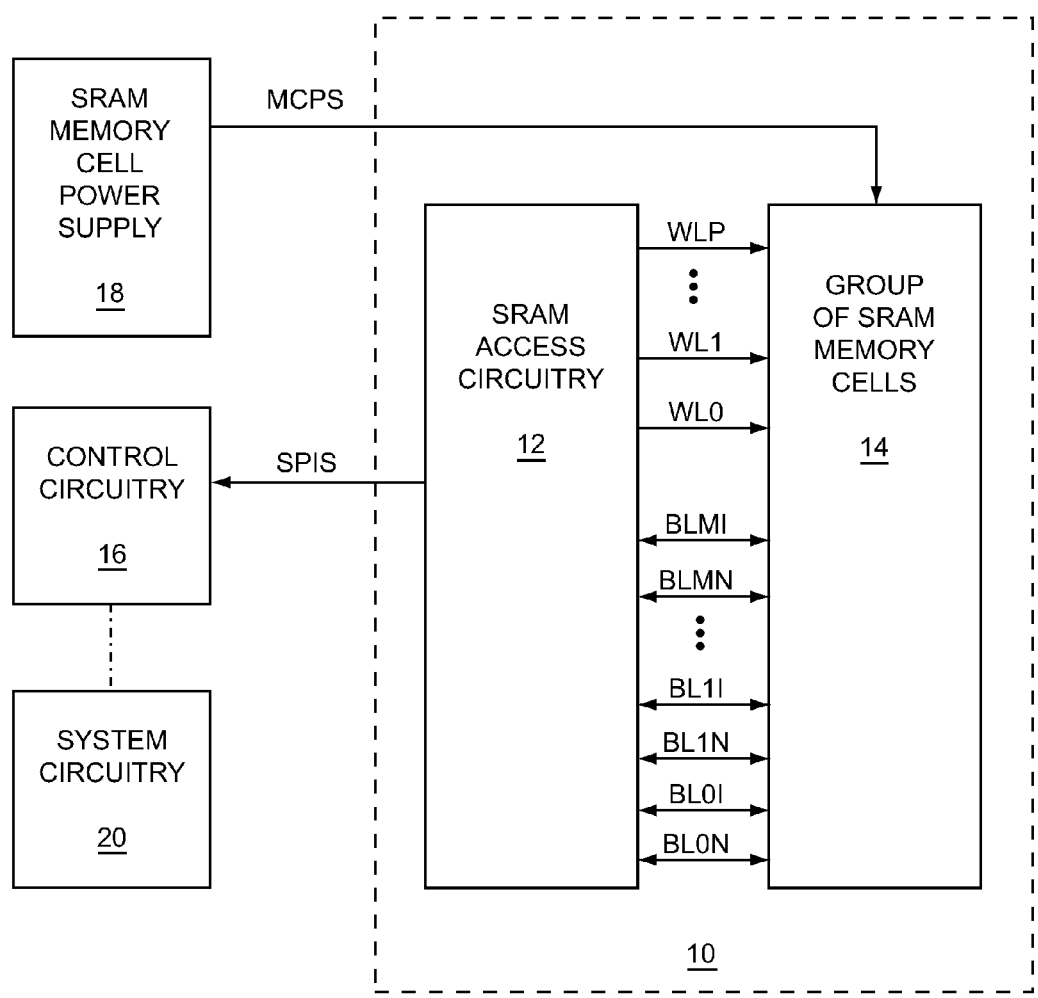
FIG. 3 shows the circuitry according to an additional embodiment of the circuitry.

FIG. 3 shows the circuitry 10 according to an additional embodiment of the circuitry 10. The circuitry 10 illustrated in FIG. 3 is similar to the circuitry 10 illustrated in FIG. 2 except the circuitry 10 illustrated in FIG. 3 excludes the control circuitry 16, the SRAM memory cell power supply 18, and the system circuitry 20. Alternate embodiments of the circuitry 10 may include any or all of the control circuitry 16, the SRAM memory cell power supply 18, and the system circuitry 20.

Figure 4:
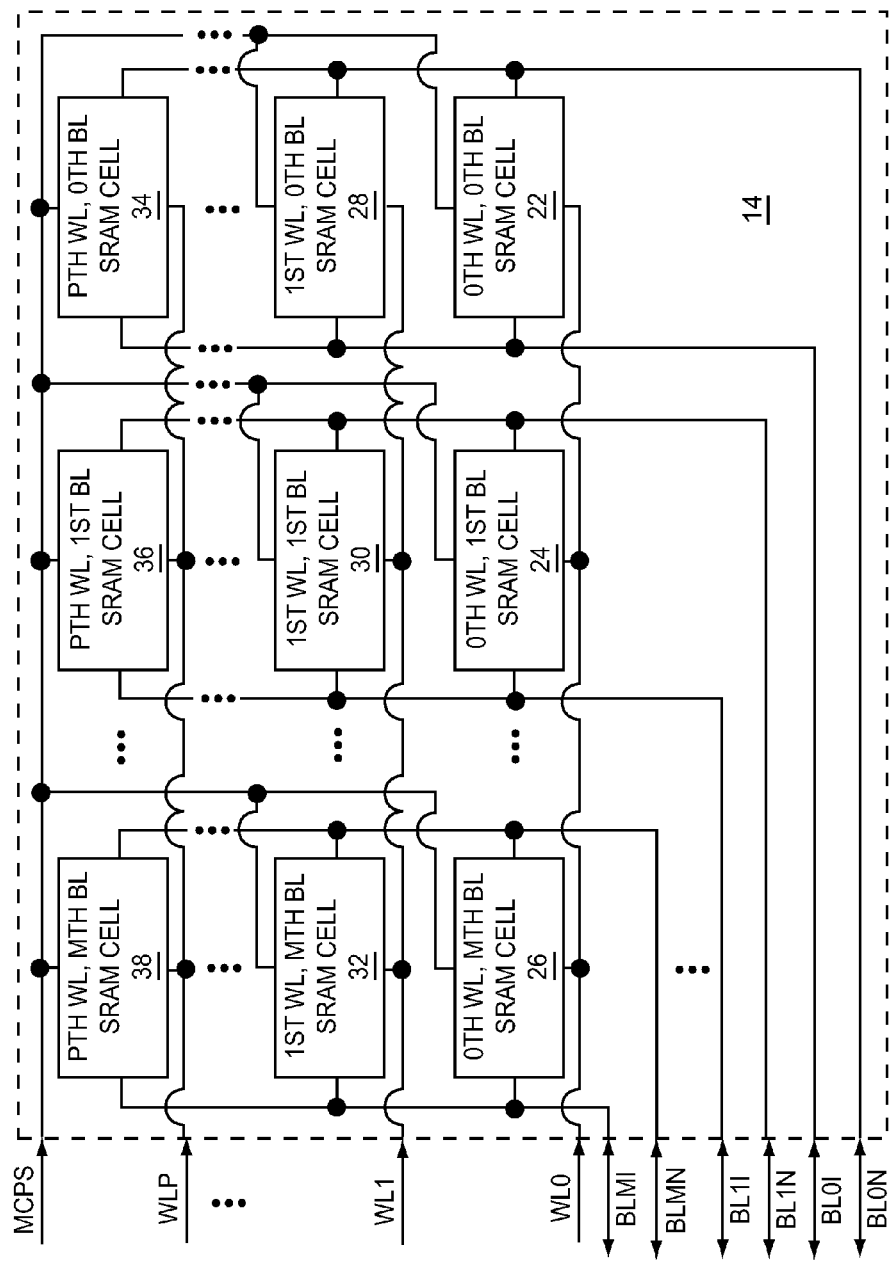
FIG. 4 shows details of a group of static random access memory (SRAM) memory cells illustrated in FIG. 1 according to one embodiment of the group of SRAM memory cells.

FIG. 4 shows details of the group 14 of SRAM memory cells illustrated in FIG. 1 according to one embodiment of the group 14 of SRAM memory cells. The group 14 of SRAM memory cells includes a $0^{th}$ WL, $0^{th}$ BL SRAM memory cell 22; a $0^{th}$ WL, $1^{st}$ BL SRAM memory cell 24; and up to and including a $0^{th}$ WL, $M^{th}$ BL SRAM memory cell 26. The group 14 of SRAM memory cells further includes a $1^{st}$ WL, $0^{th}$ BL SRAM memory cell 28; a $1^{st}$ WL, $1^{st}$ BL SRAM memory cell 30; and up to and including a $1^{st}$ WL, $M^{th}$ BL SRAM memory cell 32. The group 14 of SRAM memory cells additionally includes a $P^{th}$ WL, $0^{th}$ BL SRAM memory cell 34; a $P^{th}$ WL, $1^{st}$ BL SRAM memory cell 36; and a $P^{th}$ WL, $M^{th}$ BL SRAM memory cell 38.

Each of the SRAM memory cells 22, 24, 26, 28, 30, 32, 34, 36, 38 is coupled to the SRAM memory cell power supply 18 (FIG. 2). As such, each of the SRAM memory cells 22, 24, 26, 28, 30, 32, 34, 36, 38 receives the memory cell power supply signal MCPS. The group 14 of SRAM memory cells is arranged into multiple rows of SRAM memory cells 22, 24, 26, 28, 30, 32, 34, 36, 38 and multiple columns of SRAM memory cells 22, 24, 26, 28, 30, 32, 34, 36, 38. Specifically, the group 14 of SRAM memory cells illustrated in FIG. 4 includes a first row, a second row, and up to and including a P+1 row. Further, the group 14 of SRAM memory cells includes a first column, a second column, and up to and including an M+1 column. Each row is coupled to a corresponding one of the wordlines WL0, WL1, WLP. As such, each row is associated with one word of the group 14 of SRAM memory cells. Further, each word of the group 14 of SRAM memory cells includes M+1 bits.

The $0^{th}$ WL SRAM memory cells 22, 24, 26 are coupled to the $0^{th}$ wordline WL0. The $1^{st}$ WL SRAM memory cells 28, 30, 32 are coupled to the $1^{st}$ wordline WL1. The $P^{th}$ WL SRAM memory cells 34, 36, 38 are coupled to the $P^{th}$ wordline WLP. The $0^{th}$ BL SRAM memory cells 22, 28, 34 are coupled to the $0^{th}$ inverting bitline BL0I. The $0^{th}$ BL SRAM memory cells 22, 28, 34 are coupled to the $0^{th}$ non-inverting bitline BL0N. The $1^{st}$ BL SRAM memory cells 24, 30, 36 are coupled to the $1^{st}$ inverting bitline BL1I. The $1^{st}$ BL SRAM memory cells 24, 30, 36 are coupled to the $1^{st}$ non-inverting bitline BL1N. The $M^{th}$ BL SRAM memory cells 26, 32, 38 are coupled to the $M^{th}$ inverting bitline BLMI. The $M^{th}$ BL SRAM memory cells 26, 32, 38 are coupled to the $M^{th}$ non-inverting bitline BLMN. Alternate embodiments of the group 14 of SRAM memory cells may have other groupings of the SRAM memory cells 22, 24, 26, 28, 30, 32, 34, 36, 38, including any number of rows, any number of columns, multiple banks, the like, or any combination thereof.

Figure 5:
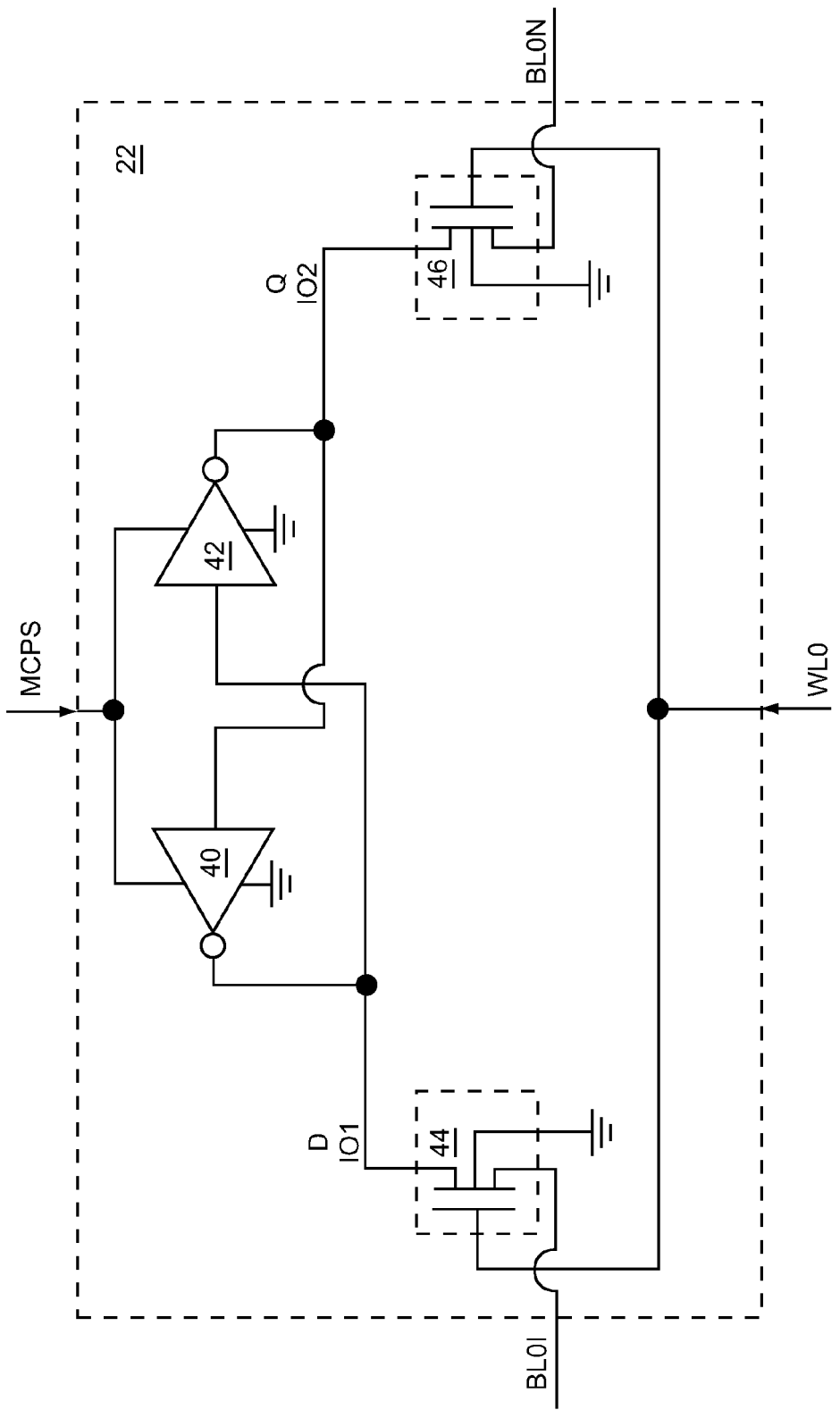
FIG. 5 shows details of a $0^{th}$ WL, $0^{th}$ BL SRAM memory cell illustrated in FIG. 4 according to one embodiment of the $0^{th}$ WL, $0^{th}$ BL SRAM memory cell.

FIG. 5 shows details of the $0^{th}$ WL, $0^{th}$ BL SRAM memory cell 22 illustrated in FIG. 4 according to one embodiment of the $0^{th}$ WL, $0^{th}$ BL SRAM memory cell 22. The $0^{th}$ WL, $0^{th}$ BL SRAM memory cell 22 includes a first inverter 40, a second inverter 42, a first access transistor element 44, and a second access transistor element 46. An output from the first inverter 40 is coupled to an input to the second inverter 42 and provides a data D node. An output from the second inverter 42 is coupled to an input to the first inverter 40 and provides an output Q node. As such, the first inverter 40 and the second inverter 42 form a pair of cross-coupled inverters having the data D node and the output Q node. The output from the first inverter 40 provides a first inverter output signal IO1 and the output from the second inverter 42 provides a second inverter output signal IO2. In this regard, during a first of the two stable states, a LOW logic level is at the input to the first inverter 40 and a HIGH logic level is at the input to the second inverter 42. Conversely, during a second of the two stable states, a HIGH logic level is at the input to the first inverter 40 and a LOW logic level is at the input to the second inverter 42.

In general, one of the group 14 (FIG. 1) of SRAM memory cells or one of the portion of the group 14 (FIG. 1) of SRAM memory cells includes a pair of cross-coupled inverters, such that an output from one of the pair of cross-coupled inverters is coupled to an input to another of the pair of cross-coupled inverters. Further, an output from the another of the pair of cross-coupled inverters is coupled to an input to the one of the pair of cross-coupled inverters. Additionally, during the first of the two stable states, a LOW logic level is at the input to the one of the pair of cross-coupled inverters and a HIGH logic level is at the input to the another of the pair of cross-coupled inverters. During the second of the two stable states, a HIGH logic level is at the input to the one of the pair of cross-coupled inverters and a LOW logic level is at the input to the another of the pair of cross-coupled inverters.

The first inverter 40 and the second inverter 42 are both coupled to the SRAM memory cell power supply 18 (FIG. 2). As such, the SRAM memory cell power supply 18 provides power to the first inverter 40 and the second inverter 42 via the memory cell power supply signal MCPS. Therefore, when either the first inverter 40 or the second inverter 42 has a HIGH logic level at its output, a voltage at its output is about equal to a voltage of the memory cell power supply signal MCPS.

The first access transistor element 44 is coupled between the input to the second inverter 42 and the $0^{th}$ inverting bitline BL0I. The second access transistor element 46 is coupled between the input to the first inverter 40 and the $0^{th}$ non-inverting bitline BL0N. Gates of both the first access transistor element 44 and the second access transistor element 46 are coupled to the $0^{th}$ wordline WL0. In one embodiment of the first access transistor element 44, the first access transistor element 44 is an NMOS transistor element, as illustrated. In one embodiment of the second access transistor element 46, the second access transistor element 46 is an NMOS transistor element, as illustrated.

In general, one of the group 14 (FIG. 1) of SRAM memory cells or one of the portion of the group 14 (FIG. 1) of SRAM memory cells further includes one access transistor element, which may be an NMOS transistor element, and another access transistor element, which may be an NMOS transistor element. The one access transistor element is coupled between the input to the one of the pair of cross-coupled inverters and one bitline. The another access transistor element is coupled between the input to the another of the pair of cross-coupled inverters and another bitline. A gate of the one access transistor element and a gate of the another access transistor element are both coupled to a wordline.

When the $0^{th}$ WL, $0^{th}$ BL SRAM memory cell 22 is not being read from, written to, or driven into a metastable state, the $0^{th}$ wordline WL0 is at a LOW logic level, such that both access transistor elements 44, 46 are in an OFF state. As such, the first inverter 40 and the second inverter 42 are isolated from the $0^{th}$ inverting bitline BL0I and the $0^{th}$ non-inverting bitline BL0N, and the $0^{th}$ WL, $0^{th}$ BL SRAM memory cell 22 has either the first stable state or the second stable state, as described above. When the $0^{th}$ WL, $0^{th}$ BL SRAM memory cell 22 is being read from, the $0^{th}$ inverting bitline BL0I and the $0^{th}$ non-inverting bitline BL0N are both precharged to a HIGH logic level. Then, the $0^{th}$ wordline WL0 is at a HIGH logic level, such that both access transistor elements 44, 46 are in an ON state. As such, the first inverter 40 drives the $0^{th}$ inverting bitline BL0I via the first access transistor element 44 and the second inverter 42 drives the $0^{th}$ non-inverting bitline BL0N via the second access transistor element 46. The SRAM access circuitry 12 reads the $0^{th}$ WL, $0^{th}$ BL SRAM memory cell 22 via the $0^{th}$ bitlines BL0I, BL0N. Conventionally, both access transistor elements 44, 46 are sized to be insufficiently strong to flip the $0^{th}$ WL, $0^{th}$ BL SRAM memory cell 22 when one of the access transistor elements 44, 46 discharges the precharge on the $0^{th}$ bitlines BL0I, BL0N.

When the $0^{th}$ WL, $0^{th}$ BL SRAM memory cell 22 is being written to, the $0^{th}$ wordline WL0 is at the HIGH logic level, such that both access transistor elements 44, 46 are in the ON state. The SRAM access circuitry 12 provides write data by driving the $0^{th}$ bitlines BL0I, BL0N with the write data. If the write data matches the data previously stored in the $0^{th}$ WL, $0^{th}$ BL SRAM memory cell 22, then the $0^{th}$ inverting bitline BL0I will have the same logic level as the first inverter output signal IO1 and the $0^{th}$ non-inverting bitline BL0N will have the same logic level as the second inverter output signal IO2. However, if the write data does not match the data previously stored in the $0^{th}$ WL, $0^{th}$ BL SRAM memory cell 22, then the $0^{th}$ inverting bitline BL0I will have an opposite logic level from the first inverter output signal IO1 and the $0^{th}$ non-inverting bitline BL0N will have an opposite logic level from the second inverter output signal IO2. In one embodiment of the $0^{th}$ WL, $0^{th}$ BL SRAM memory cell 22, NMOS transistor elements have a greater drive strength than PMOS transistor elements. As such, the one of the $0^{th}$ bitlines BL0I, BL0N that has the LOW logic level will over-power the PMOS transistor element in a corresponding one of the inverters 40, 42, thereby causing the cross-coupled pair of inverters 40, 42 to toggle between the two stable states.

In one embodiment of the circuitry 10, the SRAM access circuitry 12 forces the $0^{th}$ WL, $0^{th}$ BL SRAM memory cell 22 into the metastable state by driving both $0^{th}$ bitlines BL0I, BL0N to either the LOW logic level or the HIGH logic level. If both $0^{th}$ bitlines BL0I, BL0N are driven to the LOW logic level, then the SRAM access circuitry 12 drives the $0^{th}$ wordline WL0 to the HIGH logic level, such that both access transistor elements 44, 46 are in the ON state. Further, If both $0^{th}$ bitlines BL0I, BL0N are driven to the HIGH logic level, then the SRAM access circuitry 12 drives the $0^{th}$ wordline WL0 to a voltage that is greater than the voltage of the memory cell power supply signal MCPS, such that both access transistor elements 44, 46 are in the ON state. In one embodiment of the circuitry 10, the voltage of $0^{th}$ wordline WL0 is greater than or equal to a sum of the voltage of the memory cell power supply signal MCPS and a highest threshold voltage of both access transistor elements 44, 46. Next, the SRAM access circuitry 12 simultaneously releases each of the cross-coupled pair of inverters 40, 42, by de-asserting the $0^{th}$ wordline WL0, such that the $0^{th}$ WL, $0^{th}$ BL SRAM memory cell 22 selects one of two stable states.

In a first embodiment of the circuitry 10, the SRAM access circuitry 12 forces the $0^{th}$ WL, $0^{th}$ BL SRAM memory cell 22 into the metastable state by driving both $0^{th}$ bitlines BL0I, BL0N to the LOW logic level and driving the $0^{th}$ wordline WL0 to the HIGH logic level, such that both access transistor elements 44, 46 are in the ON state. As such, the inputs to and the outputs from both inverters 40, 42 are driven toward the LOW logic level. Actual voltages at the inputs to and the outputs from both inverters 40, 42 are based on voltage divisions between PMOS transistor elements in each of the inverters 40, 42 and corresponding access transistor elements 44, 46. In general, during the metastable state, a voltage level between the LOW logic level and the HIGH logic level is at the input to the one of the pair of cross-coupled inverters; a voltage level between the LOW logic level and the HIGH logic level is at the input to the another of the pair of cross-coupled inverters; the LOW logic level is at the one bitline, the LOW logic level is at the another bitline, and the HIGH logic level is at the wordline.

In a second embodiment of the circuitry 10, the SRAM access circuitry 12 forces the $0^{th}$ WL, $0^{th}$ BL SRAM memory cell 22 into the metastable state by driving both $0^{th}$ bitlines BL0I, BL0N to the HIGH logic level and driving the $0^{th}$ wordline WL0 to a voltage that is greater than the voltage of the memory cell power supply signal MCPS, such that both access transistor elements 44, 46 are in the ON state. As such, the inputs to and the outputs from both inverters 40, 42 are driven toward the HIGH logic level. Actual voltages at the inputs to and the outputs from both inverters 40, 42 are based on voltage divisions between NMOS transistor elements in each of the inverters 40, 42 and corresponding access transistor elements 44, 46. In general, during the metastable state, a voltage level between the HIGH logic level and the LOW logic level is at the input to the one of the pair of cross-coupled inverters, a voltage level between the HIGH logic level and the LOW logic level is at the input to the another of the pair of cross-coupled inverters, the HIGH logic level is at the one bitline, the HIGH logic level is at the another bitline, and a voltage that is greater than the voltage of the memory cell power supply signal MCPS is presented at the wordline.

In one embodiment of the circuitry 10, when the inputs to and the outputs from both inverters 40, 42 are driven toward the HIGH logic level, the access transistor elements 44, 46 must be overdriven in order to properly provide sufficient voltage at the inputs to and the outputs from both inverters 40, 42. In general, during the metastable state, a voltage level between the HIGH logic level and the LOW logic level is at the input to the one of the pair of cross-coupled inverters, a voltage level between the HIGH logic level and the LOW logic level is at the input to the another of the pair of cross-coupled inverters, the HIGH logic level is at the one bitline, the HIGH logic level is at the another bitline, and the wordline is overdriven, such that a voltage at the wordline is greater than the voltage of the memory cell power supply signal MCPS. In a first exemplary embodiment of the circuitry 10, the voltage at the wordline is equal to about 1.5 volts, the voltage of the SRAM memory cell power supply 18 is equal to about 1.0 volts, the voltage at the one bitline is equal to about 1.0 volts, and the voltage at the another bitline is equal to about 1.0 volts. In a second exemplary embodiment of the circuitry 10, the voltage at the wordline is equal to about 1.0 volts, the voltage of the SRAM memory cell power supply 18 is equal to about 0.5 volts, the voltage at the one bitline is equal to about 0.5 volts, and the voltage at the another bitline is equal to about 0.5 volts.

In one embodiment of the circuitry 10, the voltage at the wordline is based on the VDD power supply (not shown); and the voltage at the one bitline and the voltage at the other bitline are based on the SRAM memory cell power supply 18 (FIG. 2). In one embodiment of the circuitry 10, the voltage at the one bitline is about equal to the voltage at the wordline divided by a first constant; and the voltage at the another bitline is about equal to the voltage at the wordline divided by the first constant. In a third exemplary embodiment of the circuitry 10, the first constant is equal to about two. In a fourth exemplary embodiment of the circuitry 10, the first constant is equal to about three. In a fifth exemplary embodiment of the circuitry 10, the first constant is equal to about 1.5.

Figure 6:
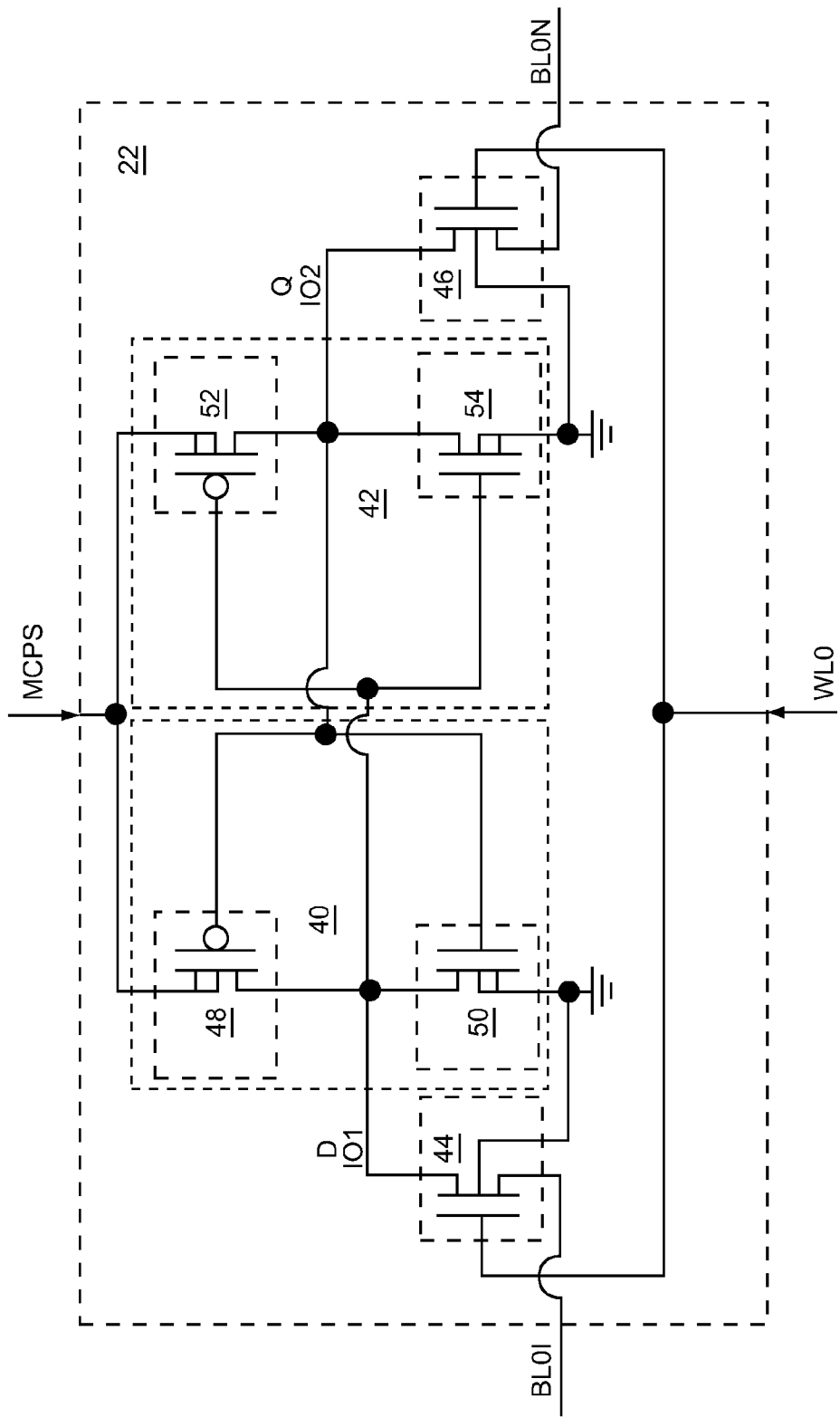
FIG. 6 shows details of the $0^{th}$ WL, $0^{th}$ BL SRAM memory cell illustrated in FIG. 5 according to an alternate embodiment of the $0^{th}$ WL, $0^{th}$ BL SRAM memory cell.

FIG. 6 shows details of the $0^{th}$ WL, $0^{th}$ BL SRAM memory cell 22 illustrated in FIG. 5 according to an alternate embodiment of the $0^{th}$ WL, $0^{th}$ BL SRAM memory cell 22. The first inverter 40 includes a first PMOS transistor element 48 and a first NMOS transistor element 50. The second inverter 42 includes a second PMOS transistor element 52 and a second NMOS transistor element 54. The first PMOS transistor element 48 is coupled between the SRAM memory cell power supply 18 (FIG. 2) and the output from the first inverter 40. The first NMOS transistor element 50 is coupled between the output from the first inverter 40 and a ground. In this regard, the first PMOS transistor element 48 and the first NMOS transistor element 50 are coupled in series between the SRAM memory cell power supply 18 (FIG. 2) and the ground. Gates of the first PMOS transistor element 48 and the first NMOS transistor element 50 are coupled to the output from the second inverter 42.

The second PMOS transistor element 52 is coupled between the SRAM memory cell power supply 18 (FIG. 2) and the output from the second inverter 42. The second NMOS transistor element 54 is coupled between the output from the second inverter 42 and the ground. In this regard, the second PMOS transistor element 52 and the second NMOS transistor element 54 are coupled in series between the SRAM memory cell power supply 18 (FIG. 2) and the ground. Gates of the second PMOS transistor element 52 and the second NMOS transistor element 54 are coupled to the output from the first inverter 40.

In general, according to one embodiment of the circuitry 10, one of the pair of cross-coupled inverters includes the first PMOS transistor element 48 and a first NMOS transistor element 50. The first PMOS transistor element 48 is coupled between the SRAM memory cell power supply 18 (FIG. 2) and the output from the one of the pair of cross-coupled inverters. The first NMOS transistor element 50 is coupled between the output from the one of the pair of cross-coupled inverters and the ground. Gates of the first PMOS transistor element 48 and the first NMOS transistor element 50 are coupled to the output from another of the pair of cross-coupled inverters. The another of the pair of cross-coupled inverters includes the second PMOS transistor element 52 and the second NMOS transistor element 54. The second PMOS transistor element 52 is coupled between the SRAM memory cell power supply 18 (FIG. 2) and the output from the another of the pair of cross-coupled inverters. The second NMOS transistor element 54 is coupled between the output from the another of the pair of cross-coupled inverters and the ground. Gates of the second PMOS transistor element 52 and the second NMOS transistor element 54 are coupled to the output from the one of the pair of cross-coupled inverters.

Since the $0^{th}$ WL, $0^{th}$ BL SRAM memory cell 22 includes the first access transistor element 44, the second access transistor element 46, the first PMOS transistor element 48, the first NMOS transistor element 50, the second PMOS transistor element 52, and the second NMOS transistor element 54, the $0^{th}$ WL, $0^{th}$ BL SRAM memory cell 22 is a six transistor SRAM cell. In general, one of the group 14 (FIG. 1) of SRAM memory cells or one of the portion of the group 14 (FIG. 1) of SRAM memory cells is a six transistor SRAM cell.

Figure 7:
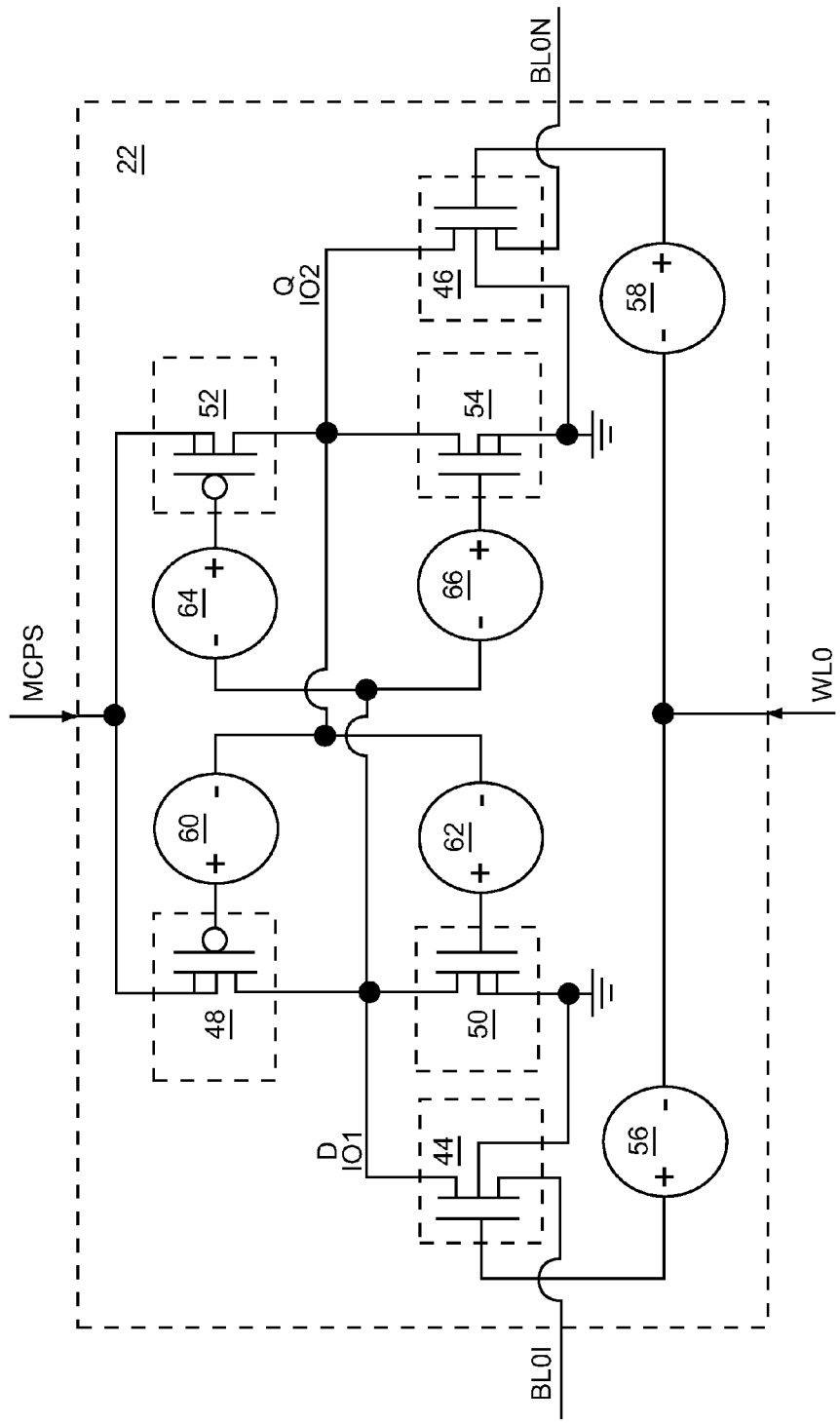
FIG. 7 shows details of the $0^{th}$ WL, $0^{th}$ BL SRAM memory cell illustrated in FIG. 6 according to an illustrative embodiment of the $0^{th}$ WL, $0^{th}$ BL SRAM memory cell.

FIG. 7 shows details of the $0^{th}$ WL, $0^{th}$ BL SRAM memory cell 22 illustrated in FIG. 6 according to an illustrative embodiment of the $0^{th}$ WL, $0^{th}$ BL SRAM memory cell 22. The $0^{th}$ WL, $0^{th}$ BL SRAM memory cell 22 illustrated in FIG. 7 is similar to the $0^{th}$ WL, $0^{th}$ BL SRAM memory cell 22 illustrated in FIG. 6, except the transistor elements 44, 46, 48, 50, 52, 54 illustrated in FIG. 7 have inherent process induced threshold voltage mismatches, which are represented as threshold voltage variances 56, 58, 60, 62, 64, 66 that appear in series with the gates of the transistor elements 44, 46, 48, 50, 52, 54.

Specifically, the first access transistor element 44 has a first threshold voltage variance 56. The second access transistor element 46 has a second threshold voltage variance 58. The first PMOS transistor element 48 has a third threshold voltage variance 60. The first NMOS transistor element 50 has a fourth threshold voltage variance 62. The second PMOS transistor element 52 has a fifth threshold voltage variance 64. The second NMOS transistor element 54 has a sixth threshold voltage variance 66. In this regard, in one embodiment of the $0^{th}$ WL, $0^{th}$ BL SRAM memory cell 22, the selection profile is at least partially based on at least one of the threshold voltage variances 56, 58, 60, 62, 64, 66.

Figure 8:
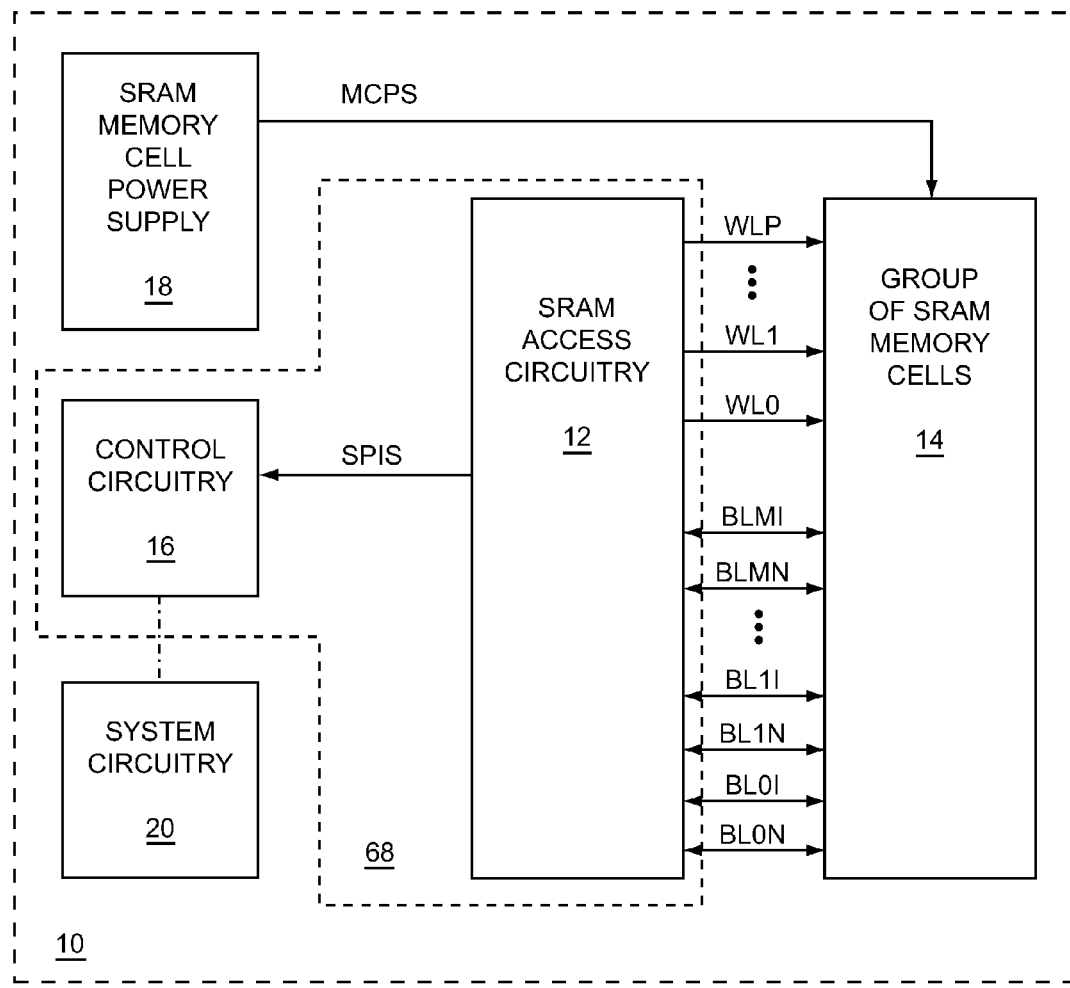
FIG. 8 shows the circuitry according to another embodiment of the circuitry.

FIG. 8 shows the circuitry 10 according to another embodiment of the circuitry 10. The circuitry 10 illustrated in FIG. 8 is similar to the circuitry 10 illustrated in FIG. 2 except the circuitry 10 illustrated in FIG. 8 further includes SRAM control circuitry 68, which includes the SRAM access circuitry 12 and the control circuitry 16. The SRAM control circuitry 68 forces at least a portion of the group 14 of SRAM memory cells into a metastable state. Further, the SRAM control circuitry 68 determines a digital fingerprint of the group 14 of SRAM memory cells based on a release of the portion of the group 14 of SRAM memory cells from the metastable state.

Figure 9:
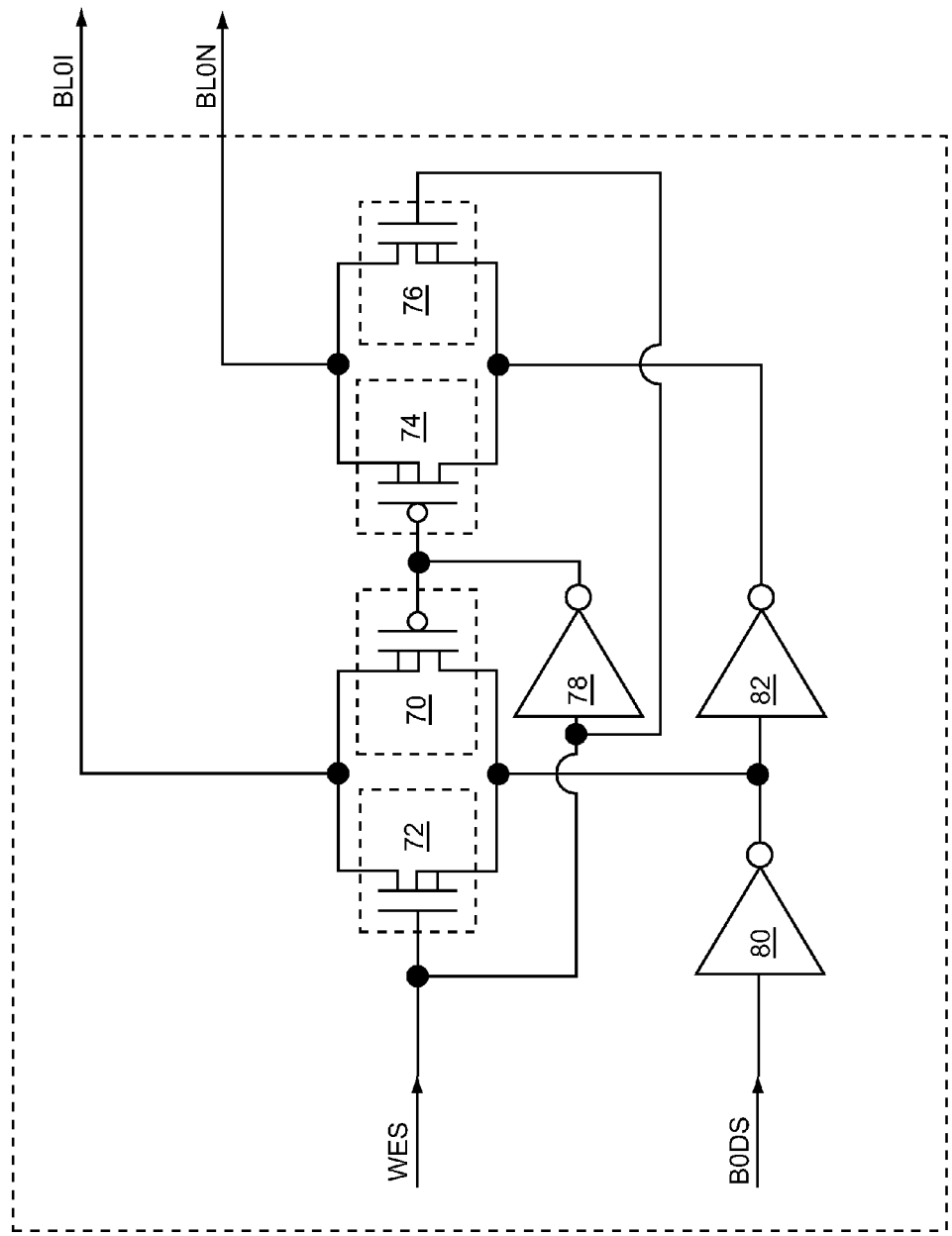
FIG. 9 shows SRAM access circuitry according to the prior art.

FIG. 9 shows SRAM access circuitry according to the prior art. The SRAM access circuitry illustrated in FIG. 9 shows typical SRAM memory cell write circuitry, which is not capable of providing any metastable states. The SRAM access circuitry includes a first bitline control PMOS transistor element 70, a first bitline control NMOS transistor element 72, a second bitline control PMOS transistor element 74, a second bitline control NMOS transistor element 76, a first bitline control inverter 78, a second bitline control inverter 80, and a third bitline control inverter 82.

The first bitline control PMOS transistor element 70 is coupled between an output from the second bitline control inverter 80 and a $0^{th}$ inverting bitline BL0I. The first bitline control NMOS transistor element 72 is coupled between the output from the second bitline control inverter 80 and the $0^{th}$ inverting bitline BL0I. The second bitline control PMOS transistor element 74 is coupled between an output from the third bitline control inverter 82 and a $0^{th}$ non-inverting bitline BL0N. The second bitline control NMOS transistor element 76 is coupled between the output from the third bitline control inverter 82 and the $0^{th}$ non-inverting bitline BL0N. The output from the second bitline control inverter 80 is coupled to an input to the third bitline control inverter 82.

A write enable signal WES feeds gates of the first bitline control NMOS transistor element 72 and the second bitline control NMOS transistor element 76, and feeds an input to the first bitline control inverter 78. An output from the first bitline control inverter 78 is coupled to gates of the first bitline control PMOS transistor element 70 and the second bitline control PMOS transistor element 74. When the write enable signal WES is at a LOW logic level, data writes are not enabled. As such, the gates of the first bitline control NMOS transistor element 72 and the second bitline control NMOS transistor element 76 are at a LOW logic level, and the gates of the first bitline control PMOS transistor element 70 and the second bitline control PMOS transistor element 74 are at a HIGH logic level, thereby putting the first bitline control PMOS transistor element 70, the first bitline control NMOS transistor element 72, the second bitline control PMOS transistor element 74, and the second bitline control NMOS transistor element 76 in OFF states, which isolates the $0^{th}$ inverting bitline BL0I and the $0^{th}$ non-inverting bitline BL0N from the second bitline control inverter 80 and the third bitline control inverter 82.

A bit 0 data signal B0DS feeds an input to the second bitline control inverter 80. Therefore, the output from the second bitline control inverter 80 provides a logic inversion of the bit 0 data signal B0DS and the output from the third bitline control inverter 82 provides a logic duplicate of the bit 0 data signal B0DS. As such, the output from the second bitline control inverter 80 and the output from the third bitline control inverter 82 provide logical complements of one another.

When the write enable signal WES is at a HIGH logic level, data writes are enabled. As such, the gates of the first bitline control NMOS transistor element 72 and the second bitline control NMOS transistor element 76 are at a HIGH logic level, and the gates of the first bitline control PMOS transistor element 70 and the second bitline control PMOS transistor element 74 are at a LOW logic level, thereby putting the first bitline control PMOS transistor element 70, the first bitline control NMOS transistor element 72, the second bitline control PMOS transistor element 74, and the second bitline control NMOS transistor element 76 in ON states, which connects the $0^{th}$ inverting bitline BL0I and the $0^{th}$ non-inverting bitline BL0N to the outputs from the second bitline control inverter 80 and the third bitline control inverter 82, respectively. As such, the output from the second bitline control inverter 80 provides a logic inversion of the bit 0 data signal B0DS to the $0^{th}$ inverting bitline BL0I and the output from the third bitline control inverter 82 provides a logic duplicate of the bit 0 data signal B0DS to the $0^{th}$ non-inverting bitline BL0N. Since the output from the second bitline control inverter 80 and the output from the third bitline control inverter 82 provide logical complements of one another, it is not possible for the SRAM access circuitry illustrated in FIG. 9 to provide the logic needed for the metastable states on the $0^{th}$ inverting bitline BL0I and the $0^{th}$ non-inverting bitline BL0N.

Figure 10:
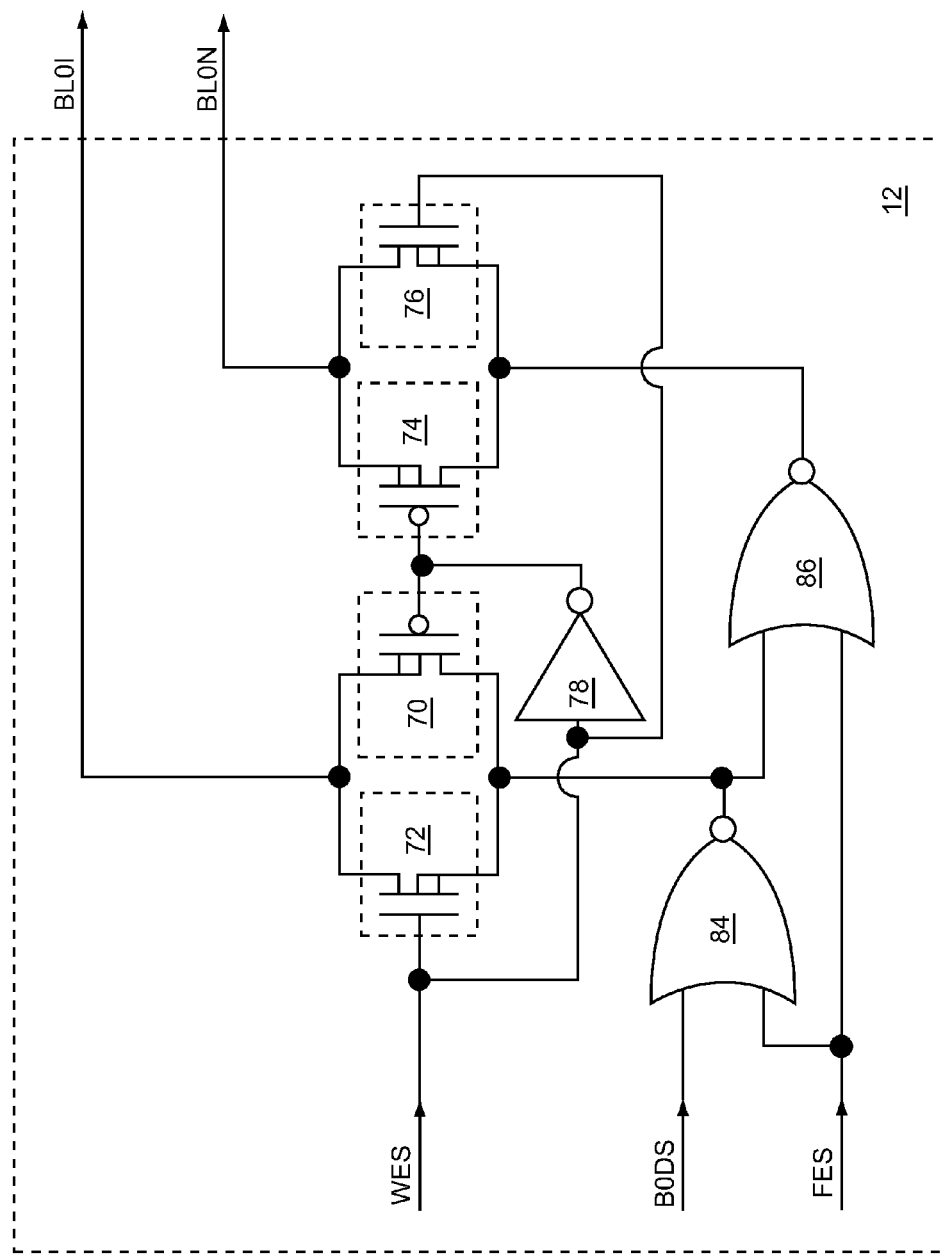
FIG. 10 shows details of the SRAM access circuitry illustrated in FIG. 1 according to one embodiment of the SRAM access circuitry.

FIG. 10 shows details of the SRAM access circuitry 12 illustrated in FIG. 1 according to one embodiment of the SRAM access circuitry 12. The SRAM access circuitry 12 illustrated in FIG. 12 shows circuitry capable of providing one of the metastable states to the $0^{th}$ inverting bitline BL0I and the $0^{th}$ non-inverting bitline BL0N. The SRAM access circuitry 12 includes a first bitline control PMOS transistor element 70, a first bitline control NMOS transistor element 72, a second bitline control PMOS transistor element 74, a second bitline control NMOS transistor element 76, a first bitline control inverter 78, a first NOR gate 84, and a second NOR gate 86.

The first bitline control PMOS transistor element 70 is coupled between an output from the first NOR gate 84 and the $0^{th}$ inverting bitline BL0I. The first bitline control NMOS transistor element 72 is coupled between the output from the first NOR gate 84 and the $0^{th}$ inverting bitline BL0I. The second bitline control PMOS transistor element 74 is coupled between an output from the second NOR gate 86 and the $0^{th}$ non-inverting bitline BL0N. The second bitline control NMOS transistor element 76 is coupled between the output from the second NOR gate 86 and the $0^{th}$ non-inverting bitline BL0N. The output from the first NOR gate 84 is coupled to a first input to the second NOR gate 86.

A write enable signal WES feeds gates of the first bitline control NMOS transistor element 72 and the second bitline control NMOS transistor element 76, and feeds an input to the first bitline control inverter 78. An output from the first bitline control inverter 78 is coupled to gates of the first bitline control PMOS transistor element 70 and the second bitline control PMOS transistor element 74. When the write enable signal WES is at a LOW logic level, data writes are not enabled. As such, the gates of the first bitline control NMOS transistor element 72 and the second bitline control NMOS transistor element 76 are at a LOW logic level, and the gates of the first bitline control PMOS transistor element 70 and the second bitline control PMOS transistor element 74 are at a HIGH logic level, thereby putting the first bitline control PMOS transistor element 70, the first bitline control NMOS transistor element 72, the second bitline control PMOS transistor element 74, and the second bitline control NMOS transistor element 76 in OFF states, which isolates the $0^{th}$ inverting bitline BL0I and the $0^{th}$ non-inverting bitline BL0N from the first NOR gate 84 and the second NOR gate 86. In one embodiment of the SRAM access circuitry 12, if only LOW logic level metastable states are used and if the $0^{th}$ inverting bitline BL0I and the $0^{th}$ non-inverting bitline BL0N are pre-charged before a memory write or forcing a LOW logic level metastable state, then the PMOS transistors 70, 74, the first bitline control inverter 78, and PMOS devices in the second NOR gate 86 may be omitted.

A bit 0 data signal B0DS feeds a first input to the first NOR gate 84. A fingerprint enable signal FES feeds second inputs to the first NOR gate 84 and the second NOR gate 86. When the fingerprint enable signal FES is at a LOW logic level, fingerprint functionality is not enabled, and the output from the first NOR gate 84 provides a logic inversion of the bit 0 data signal B0DS and the output from the second NOR gate 86 provides a logic duplicate of the bit 0 data signal B0DS. As such, the output from the first NOR gate 84 and the output from the second NOR gate 86 provide logical complements of one another.

When the write enable signal WES is at a HIGH logic level and the fingerprint enable signal FES is at the LOW logic level, data writes are enabled and fingerprint functionality is not enabled. As such, the gates of the first bitline control NMOS transistor element 72 and the second bitline control NMOS transistor element 76 are at a HIGH logic level, and the gates of the first bitline control PMOS transistor element 70 and the second bitline control PMOS transistor element 74 are at a LOW logic level, thereby putting the first bitline control PMOS transistor element 70, the first bitline control NMOS transistor element 72, the second bitline control PMOS transistor element 74, and the second bitline control NMOS transistor element 76 in ON states, which connects the $0^{th}$ inverting bitline BL0I and the $0^{th}$ non-inverting bitline BL0N to the outputs from the first NOR gate 84 and the second NOR gate 86, respectively. As such, the output from the first NOR gate 84 provides a logic inversion of the bit 0 data signal B0DS to the $0^{th}$ inverting bitline BL0I and the output from the second NOR gate 86 provides a logic duplicate of the bit 0 data signal B0DS to the $0^{th}$ non-inverting bitline BL0N.

When the write enable signal WES is at the HIGH logic level and the fingerprint enable signal FES is at the HIGH logic level, data writes are enabled and fingerprint functionality is enabled. As such, the first bitline control PMOS transistor element 70, the first bitline control NMOS transistor element 72, the second bitline control PMOS transistor element 74, and the second bitline control NMOS transistor element 76 are in ON states, which connects the $0^{th}$ inverting bitline BL0I and the $0^{th}$ non-inverting bitline BL0N to the outputs from the first NOR gate 84 and the second NOR gate 86, respectively. Since the fingerprint enable signal FES is at the HIGH logic level, the outputs from first NOR gate 84 and the second NOR gate 86 are both at the LOW logic level, which forces both the $0^{th}$ inverting bitline BL0I and the $0^{th}$ non-inverting bitline BL0N to be at the LOW logic level, thereby providing one of the metastable states.

Figure 11A:
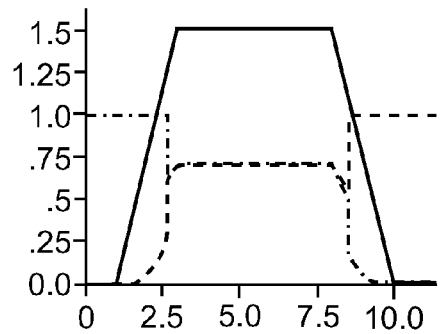
FIGS. 11A and 11B are graphs illustrating voltages of a first inverter output signal and a second inverter output signal shown in FIG. 6 of an ideal SRAM cell.
Figure 11B:
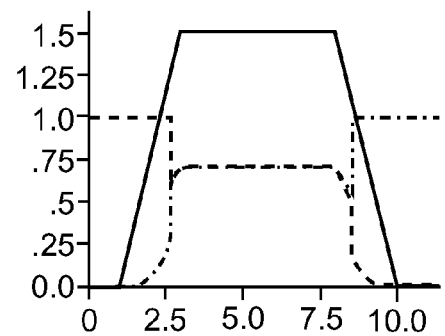
Figure 11C:
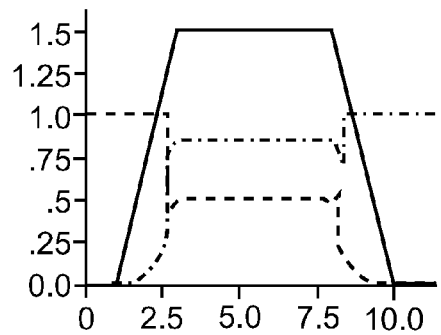
FIGS. 11C, 11D, 11E, and 11F are graphs illustrating voltages of the first inverter output signal and the second inverter output signal shown in FIG. 6 of an unbalanced SRAM cell.
Figure 11D:
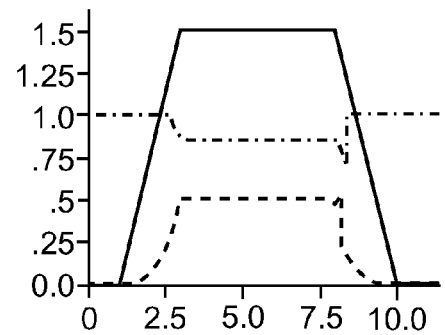
Figure 11E:
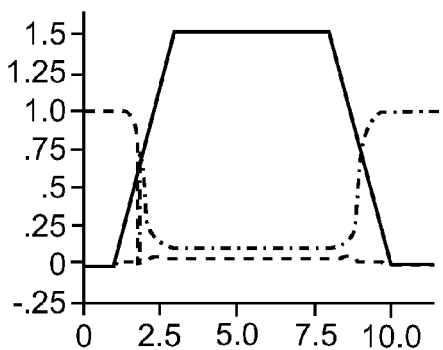
Figure 11F:
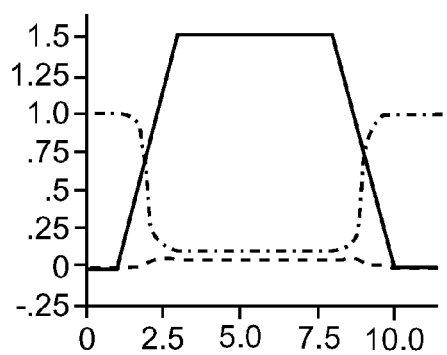

FIGS. 11A and 11B are graphs illustrating voltages of the first inverter output signal IO1 (FIG. 6) and the second inverter output signal IO2 (FIG. 6), respectively, in an ideal SRAM cell. Under these conditions, the two internal node voltages are the same and with the actual voltage determined by the ratios of the access to internal transistors in both methods with both the $0^{th}$ inverting bitline BL0I (FIG. 6) and the $0^{th}$ inverting bitline BL0I (FIG. 6) being driven to a HIGH logic level and both being driven to a LOW logic level. The final state for these cases when the wordline is de-asserted is primarily the result of noise inside the cell.

FIGS. 11C, 11D, 11E, and 11F are graphs illustrating voltages of the first inverter output signal IO1 (FIG. 6) and the second inverter output signal 102 (FIG. 6) in an unbalanced SRAM cell. When the wordline voltage is greater than the SRAM array voltage and the inverting bitline BL0I is at a logic HIGH level and the non inverting bitline BL0N is at a logic HIGH level or the inverting bitline BL0I is at a logic LOW level and the non inverting bitline BL0N is at a logic LOW level, the different drive strengths of the inverters cause the two internal signals IO1, IO2 to be at different voltages, creating a voltage difference as shown in FIGS. 11C-11F. As the inverters have nominally identical dimensions, this voltage difference is due to the process variation induced mismatch. This voltage offset between the two internal nodes is a property of the SRAM cell and is invariant with the data stored in the cell.

When the cell is released from this metastable state the small initial mismatch is amplified by positive feedback in the coupled inverter pair and the cell transitions to one of the two stable states. Since this mismatch is more influenced by intrinsic process variations than noise, the cell always moves to one final state, which may be close to the preferred state. The preferred state is one in which the SRAM cell states collapse under influence of only process induced mismatch in the cell transistors. Thus reliable and un-clonable fingerprints can be comprised of the SRAM preferred state. The mismatch in SRAM constituent transistors is in general increasing, so that the method promises to be useful in future fabrication processes.

Although in both methods, namely with both the $0^{th}$ inverting bitline BL0I (FIG. 6) and the $0^{th}$ non-inverting bitline BL0N (FIG. 6) being driven to a HIGH logic level, also referred to as a BLs=1 method, and both being driven to a LOW logic level, also referred to as a BLs=0 method, the SRAM cell is forced to a metastable state, the bitline amplitude voltage plays a great role in determining the mismatch in the internal nodes (IO1-IO2) (FIG. 6) also denoted as ($V_D$-$V_Q$) voltage (Offset). The mismatches in both cases are a result of the threshold voltage variance $\Delta V_T$ ratios of different transistor pairs. The effect of each transistor on the offset was studied by representing the SRAM cell with voltage sources to model the individual transistor $\Delta V_T$.

Figure 12A:
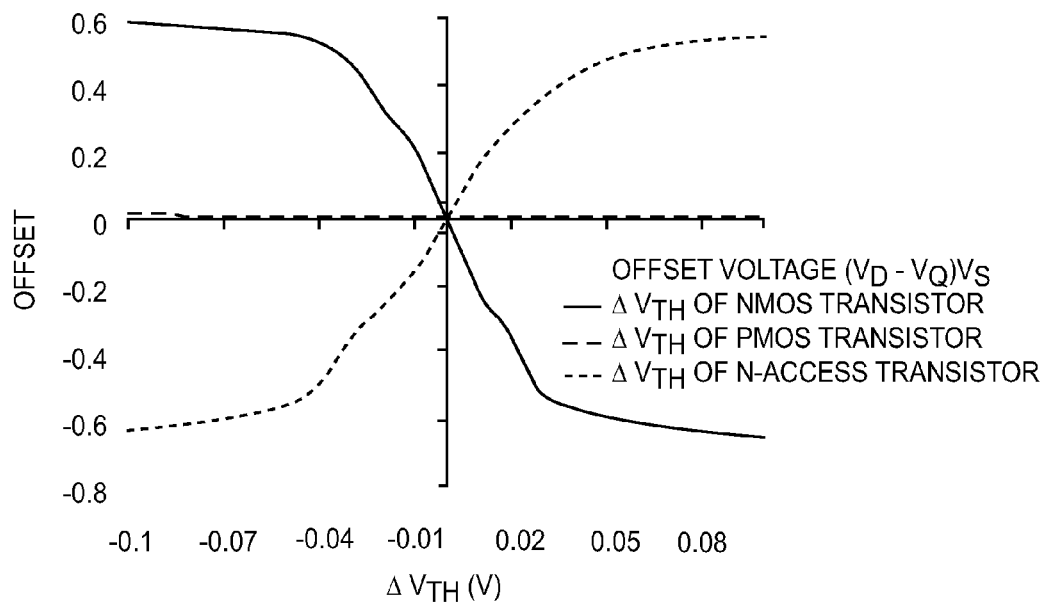
FIG. 12A shows effects of a pull-down NMOS transistor and an access NMOS transistor on offset voltage.
Figure 12B:
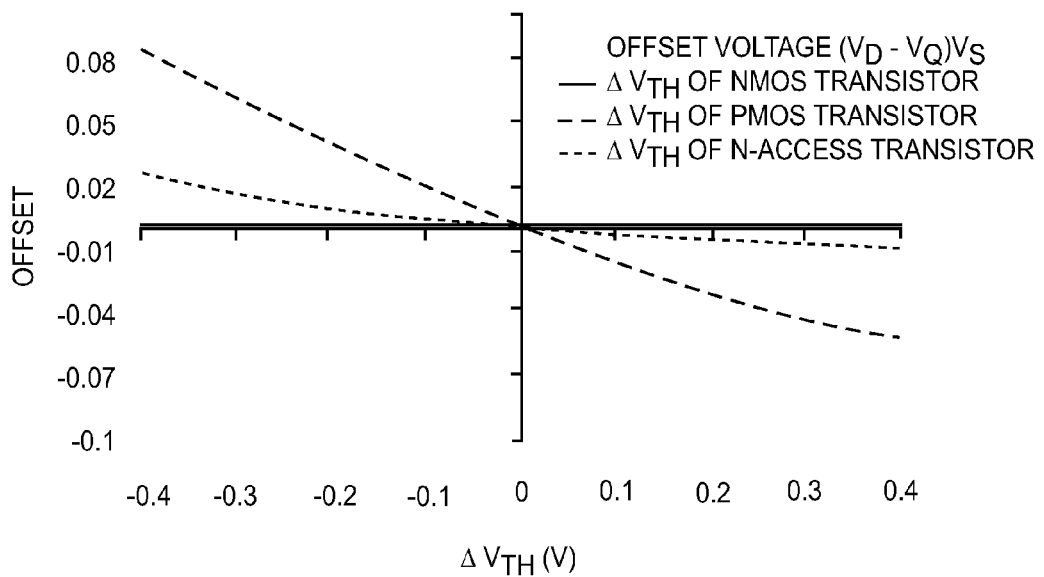
FIG. 12B shows effects of a pull-up PMOS transistor and an access NMOS transistor on offset voltage.

In the proposed BLs=1 method, the pull-down NMOS transistor 50 or 54 (FIG. 6) and the access NMOS transistor 44 or 46 (FIG. 6) have a dominant effect on the offset as shown in FIG. 12A. This is evident from the fact that changing the $\Delta V_T$ of the pull-up PMOS transistor 48 or 52 (FIG. 6) has almost no effect on the offset. In the proposed method BLs=0, the $\Delta V_T$s of the pull down NMOS 50 or 54 (FIG. 6) has almost no effect while the $\Delta V_T$s of the pull up PMOS 48 or 52 (FIG. 6) and the access NMOS transistors 44 or 46 (FIG. 6) dominate the voltage offset, as shown in FIG. 12B. Thus in BLs=0 method, the final stable state chosen by the SRAM cell is primarily a result of the relative strengths of the pull-up PMOS and the access NMOS while in BLs=1 method, it is almost exclusively the result of the relative strengths of the pull-down NMOS and the access NMOS.

In the proposed BLs=0, the SRAM cell's internal nodes are forced to a metastable state close to the 00 state where the internal nodes IO1 (FIG. 6) and IO2 (FIG. 6) are both at a logic LOW level as in power-up. However, the nodes D (FIG. 6) and Q (FIG. 6) are not exactly at 0V as in power-up, but at a voltage level slightly greater than 0V. Furthermore, the inherent cell mismatch places the voltage on one node IO1 (FIG. 6) or IO2 (FIG. 6) slightly greater that the other corresponding internal node IO2 (FIG. 6) or IO1 (FIG. 6) which feeds the positive feedback and takes that particular node to the logic '1' or MCPS volts. The state chosen is distinctly different from the power-up state of the SRAM cell where both internal nodes start exactly at 0 volts and the probability of noise affecting either node is identical.

An illustration that the disclosed method, i.e., forcing the internal nodes to '11' or '00' using WL voltage higher than MCPS voltage and then releasing them, is more immune to external noise and temperature fluctuations than the SRAM power-up is presented.

For an inverter in the transition region above threshold, (as the proposed method is used in above threshold region), both the PMOS and the NMOS are in the saturation region. Hence the input and output voltages $V_I$ and $V_O$ respectively, are related by $$\tfrac{1}{2}K_N(V_i-V_{TN})^2(1+\lambda_N V_o) = \tfrac{1}{2}K_P(V_{DD}-V_i+V_{TP})^2(1+\lambda_P(V_{DD}-V_o)) \quad (1)$$

For simplicity $K_N=K_P=K$, $\lambda_N=\lambda_P=\lambda$ and $V_{TN}=-V_{TP}=V_T$ is assumed and VDD is used in place of the memory cell power supply signal MCPS in these equations. With these simplifications, we obtain $$\tfrac{1}{2}K(V_i-V_T)^2(1+\lambda_o) = \tfrac{1}{2}K(V_{DD}-V_i+V_T)^2(1+\lambda(V_{DD}-V_o)) \quad (2)$$

And differentiating both sides w. r. t $V_i$ provides $$K(V_i - V_T)(1 + \lambda V_o) + \tfrac{1}{2}K(V_i - V_T)^2 \lambda \frac{dV_o}{dV_{in}} = \\ -K(V_{DD} - V_i - V_T)(1 + \lambda(V_{DD} - V_o)) - \tfrac{1}{2}K(V_{DD} - V_i + V_T)^2 \lambda \frac{dV_o}{dV_{in}} \quad (3)$$

Rearranging (3) gives the inverter gain $$\frac{dV_o}{dV_{in}} = -2\frac{V_i(2V_o - V_{DD}) - V_T(2/\lambda + V_{DD}) + V_{DD}(1/\lambda + V_{DD} - V_o)}{(V_i - V_T)^2 + (V_{DD} - V_i - V_T)^2} \quad (4)$$

Figure 13:
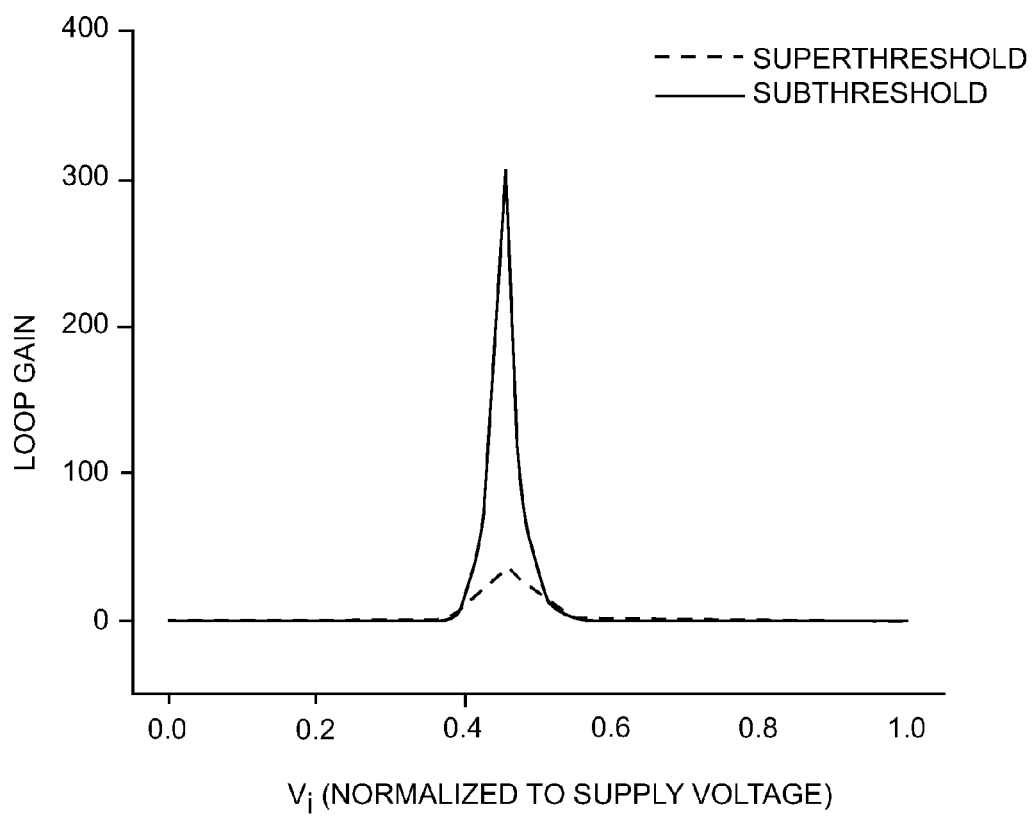
FIG. 13 illustrates a loop gain of an SRAM memory cell.

To calculate the SRAM loop gain, (4) is evaluated for $V_i=V_D$ varying from 0 to $V_{DD}$. Again for each $V_D$ the corresponding $V_O=V_Q$ is calculated (the cell right side voltage) using (2) and now evaluate (4) for $V_i=V_Q$ (i.e. $dV_D/dV_Q$) (For simplicity in this analysis, the forward and backward transfer functions are equal as the inverters are identical as per assumption and hence (4) can be used for both cases). The loop gain is the product of the derivatives and is shown in FIG. 13 (dashed line).

In the power-up method, all D (FIG. 6), and Q (FIG. 6) nodes move up from 0V to the supply voltage. WL=0 throughout, leaving individual cells isolated. Hence the coupled inverters operate through the subthreshold region during the power-up process. For an inverter in the subthreshold region the expression involving $V_I$ and $V_O$ are related by $$K_N \phi_t e^{\beta(V_1-V_{TN})/n}(1-e^{-\beta V_o}) = K_P \phi_t e^{\beta(V_{DD}-V_i+V_{TP})/n}(1-e^{-\beta(V_{DD}-V_o)}) \quad (5)$$

where $\phi_t=kT/q$ and $\beta=1/\phi_t$, n is an empirical parameter $\approx$1.6. Again we assume $K_N=K_P=K$ and $V_{TN}=-V_{TP}=V_T$. and (5) becomes $$K\phi_t e^{\beta(V_i-V_T)/n}(1-e^{-\beta V_o}) = K\phi_t e^{\beta(V_{DD}-V_i-V_T)/n}(1-e^{-\beta(V_{DD}-V_o)}) \quad (6)$$

Differentiating with respect to $V_i$ we have $$\frac{dV_o}{dV_i} = -\frac{e^{\beta(V_i-V_T)/n}(1-e^{-\beta V_o}) - e^{\beta(V_{DD}-V_i-V_T)/n} - e^{-\beta(V_{DD}-V_o)}}{n(e^{\beta(V_i-V_T)/n}e^{-\beta V_o} + e^{\beta(V_{DD}-V_i-V_T)/n}e^{-\beta(V_{DD}-V_o)})} \quad (7)$$

The loop gain during power up is given by evaluating (7) using the same procedure as described for above $V_T$-case as D (FIG. 6) and Q (FIG. 6) rise towards $V_{DD}$ as V (MCPS) rises from 0 to the nominal VDD value, and take the product of the two inverter gains. This loop gain is also shown in FIG. 13 (as the solid line). It is clear that the subthreshold loop gain is much steeper. This steeper slope near the high gain region makes the feedback system significantly more prone to wrong evaluation (away from the cell preferred state) based on small amounts of noise. Additionally, from (7) it is clear that the loop gain is also highly dependent on the operating temperature. Moreover, the methods proposed here are nearly independent of temperature, since the SRAM cell constituent transistors behave similarly with temperature, thereby keeping similar mismatch across different operating temperatures.

Figure 14:
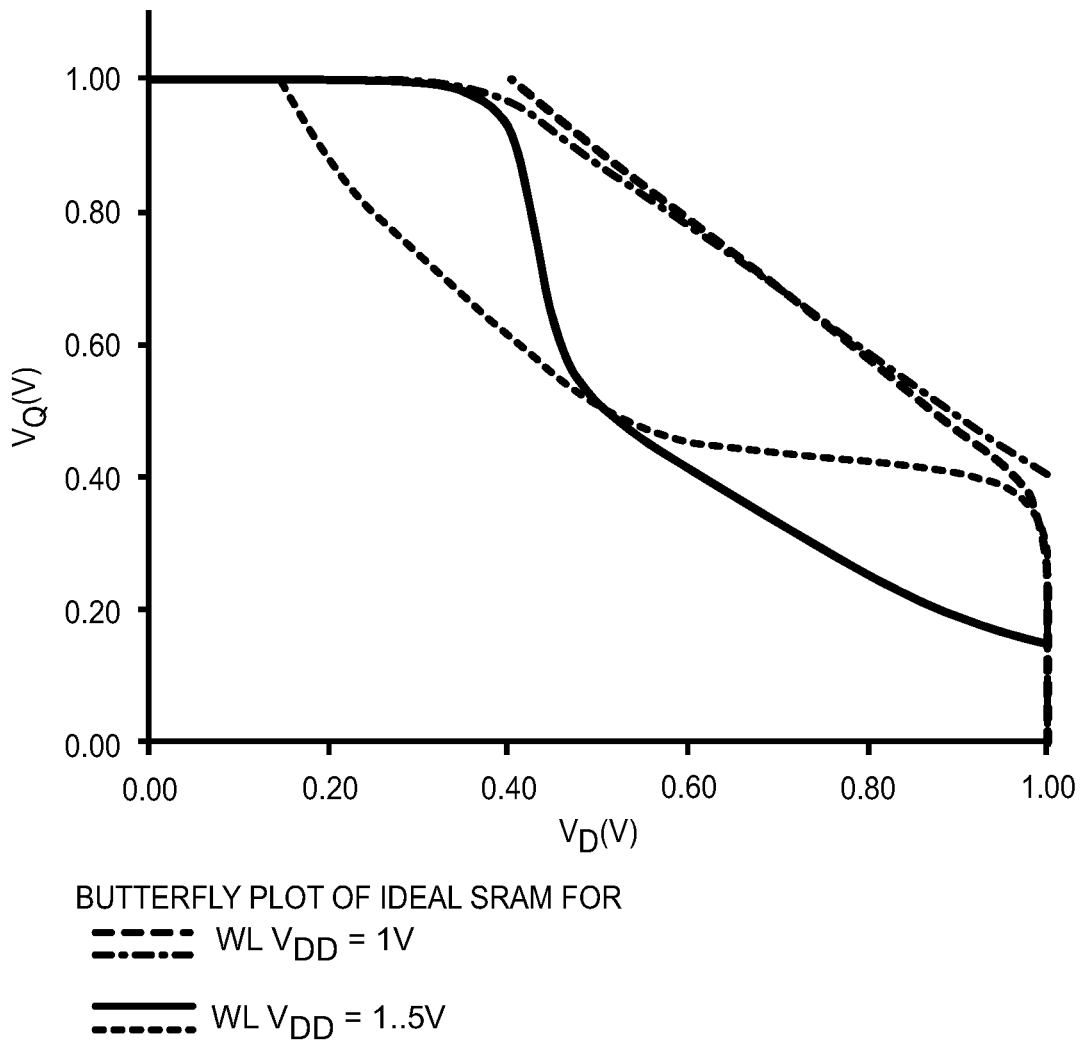
FIG. 14 shows butterfly curves for an ideal SRAM memory cell.

As noted, $V_{WL}=V_{BL}=V_{DD}$ a voltage of the memory cell power supply signal MCPS is the condition for an SRAM read operation and as an SRAM is designed to be read stable, with a finite SNM, as shown in FIG. 14. Making $V_{WL}=V_{DD}$ cannot bring the nodes D (FIG. 6) and Q (FIG. 6) to equality. Thus to bring both nodes D (FIG. 6) and Q (FIG. 6) to equal value, i.e. to collapse the butterfly curves, $V_{WL}$ higher than MCSP is required as proposed and shown in FIG. 14. A minimum $V_{WL}$ that is necessary for successful fingerprint operation is estimated.

As described above, when $V_{WL}$ is applied higher than MCSP, nodes D (FIG. 6) and Q (FIG. 6) will not be exactly equal due to mismatch and finite impedance of the access transistors. Let the nodes settle at a value $V_{Dx}$ and $V_{Qx}$. At this point the transistors in the cell are in saturation. Before $V_{WL}$ is applied, $V_D$ and $V_Q$ can be in 1 and 0 state respectively, in which case the second PMOS transistor element 52 (FIG. 6) is in saturation and the second NMOS transistor element 54 (FIG. 6) is in linear operation; and the first PMOS transistor element 48 (FIG. 6) is in linear operation and the first NMOS transistor element 50 (FIG. 6) is in saturation.

$V_D$ and $V_Q$ can be in 0 and 1 state respectively: the second PMOS transistor element 52 (FIG. 6) is in linear operation and the second NMOS transistor element 54 (FIG. 6) is in saturation; and first PMOS transistor element 48 (FIG. 6) is in saturation and the first NMOS transistor element 50 (FIG. 6) is in linear operation. Thus the high $V_{WL}$ drives all transistors into saturation. Hence, irrespective of the previous states of D (FIG. 6) and Q (FIG. 6), in saturation $V_{Dx}$ and $V_{Qx}$ assume a constant value depending on the $V_{WL}$ (as evident from FIG. 11). Thus the task is to find the minimum $V_{WL}$ such that all transistors come into saturation.

For the case $V_D=1$ and $V_Q=0$ (before $V_{WL}$ application) the second NMOS transistor element 54 (FIG. 6) and the first PMOS transistor element 48 (FIG. 6) have to be brought into saturation. Using the condition for transistors in saturation this amounts to $V_{Qx}>V_{Dx}-V_{TN1}$; and $V_{Qx}>V_{Dx}-|V_{TP0}|$. For the case $V_D=0$ and $V_Q=1$ (before $V_{WL}$ application) the first NMOS transistor element 50 (FIG. 6) and the second PMOS transistor element 52 (FIG. 6) have to be brought into saturation. Using the condition for transistors in saturation this amounts to $V_{Qx}<V_{Dx}+|V_{TP1}|$; and $V_{Dx}>V_{Qx}-V_{TN0}$. Next, assume $V_{Dx}=V_{Qx}+\alpha$. Thus, using the above conditions we obtain $$\alpha<V_{TN1} \text{ and } \alpha<|V_{TP0}| \quad (8)$$

$$\alpha>-V_{TN0} \text{ and } \alpha>|V_{TP1}| \quad (9)$$

When $\alpha$ is positive (i.e. mismatch favors $V_{Dx}>V_{Qx}$) (8) is applicable. When $\alpha$ is negative (i.e. mismatch favors $V_{Dx}<V_{Qx}$) (9) is used.

From a statistical variation of $V_T$ and (8) and (9) the minimum $\alpha_{min}$ can be calculated. This value of $\alpha$ is then used to obtain the required $V_{WL}$ as follows. The expression relating $V_{Dx}$ and $V_{Qx}$ at a particular $V_{WL}$ is obtained by equating the PMOS and NMOS currents in saturation for $I_1$ and $I_2$ along with access transistors in their linear region of operation. Thus at node Q (FIG. 6):

$$\frac{1}{2}K_{N1}(V_{Dx}-V_{TN1})^2(1+\lambda_{N1}V_{Qx}) = \quad (10)$$

$$\frac{1}{2}K_{P1}(V_{DD}-V_{Dx}+V_{TP1})^2(1+\lambda_{P1}(V_{DD}-V_{Qx})) +$$

$$K_{aL}\left(V_{WL}-V_{Qx}-V_{TaQ}-\frac{(V_{BL}-V_{Dx})}{2}\right)(V_{BL}-V_{Qx})$$

and at node D (FIG. 6)

$$\frac{1}{2}K_{N2}(V_{Qx}-V_{TN2})^2(1+\lambda_{N2}V_{Rx}) = \quad (11)$$

$$\frac{1}{2}K_{P2}(V_{DD}-V_{Qx}+V_{TP2})^2(1+\lambda_{P2}(V_{DD}-V_{Dx})) +$$

$$K_{aR}\left(V_{WL}-V_{Qx}-V_{TaD}-\frac{(V_{BL}-V_{Qx})}{2}\right)(V_{BL}-V_{Qx})$$

applies. Substituting $V_{Dx}=V_{Qx}+\alpha_{min}$ in (10) and (11) and using the device parameters and supply voltages, we can obtain the estimated minimum $V_{WL}$.

Systematic offsets may make the most of the cell flips to one direction or another. Such systematic offsets may be due to lithography mis-alignment or halo implant angles, etc. This may be removed by choosing different BLI, BLN pairs to have a 0 on BLI=logic 0 or 0 on BLN=logic 0. This choice may be pseudo-random or may be made by selecting ½ of the BL pairs, alternating by rows (WLs) by a means such as by any non-power of 2 groupings, e.g., BL0, BL1, BL2 are 0 on BLI=logic 0, and BL3, BL4, BL6 are 1 on BLI=logic 1 (opposite polarity). This will remove systematic mismatch, leaving codes that are better separated. This 0, 1s offset can be cancelled by generating a set of random bits as mask bits and by inverting the bits for all SRAM cell addresses which have the mask bit set.

The states obtained from a group of SRAM cells using the two proposed methods BLs=1 and BLs=0 can be used as two different and unique fingerprints. For greater reliability, the two methods can be combined to produce a more reliable fingerprint and an IC identifier that has very few cells in the 'X' uncertain state when the states taken by the cells are different on different trials. Such a fingerprint scheme uses some cells with states taken from the BLs=1 method and some with states from the BLs=0 methods. Taking the results from each method and performing an exclusive OR to combine the results will increase the number of uncertain cells.

To effectively combine the methods, one of the methods BLs=1 or BLs=0 or the method that produces the more reliable states in the two methods is applied and then the other BLs=0 or BLs=1 method is used on cells that are uncertain using the first method, as determined by multiple trials, where uncertain means the given cell obtains multiple states in the trials. This leaves the only uncertain cells as those that have minimal mismatch in both PMOS and NMOS transistors.

Another embodiment of generating the fingerprints is to apply one of the methods BLs=1 or BLs=0 or the method that produces the more reliable states in the two methods and then use the offset compensated value of other BLs=0 or BLs=1 method on cells that are uncertain using the first method. Thus a fingerprint with greater reliability than that of the proposed methods may be obtained by combining the results of two methods. Basically, the second method is applied only to cells that are uncertain, thereby greatly reducing the number of uncertain cells. Combining the offset cancellation with the combined methods is most effective.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   a plurality of static random access memory (SRAM) memory cells; and
   SRAM access circuitry adapted to:
      force at least a portion of the plurality of SRAM memory cells into a metastable state;
      release the portion of SRAM memory cells, such that each of the portion of SRAM memory cells selects one of two stable states; and
      provide a selection profile based on which of the two stable states was selected by each of the portion of SRAM memory cells.

2. The circuitry of claim 1 wherein control circuitry is adapted to provide a digital fingerprint of the plurality of SRAM memory cells based on the selection profile.

3. The circuitry of claim 2 further comprising the control circuitry.

4. The circuitry of claim 2 wherein the digital fingerprint is used to authenticate the circuitry.

5. The circuitry of claim 4 wherein the circuitry is an integrated circuit.

6. The circuitry of claim 2 wherein the digital fingerprint of the plurality of SRAM memory cells is an un-clonable digital fingerprint of the plurality of SRAM memory cells.

7. The circuitry of claim 1 wherein the selection profile is substantially based on an inherent process induced mismatch of the portion of SRAM memory cells.

8. The circuitry of claim 1 wherein one of the portion of SRAM memory cells comprises a pair of cross-coupled inverters, wherein
   an output from one of the pair of cross-coupled inverters is coupled to an input to another of the pair of cross-coupled inverters; and
   an output from the another of the pair of cross-coupled inverters is coupled to an input to the one of the pair of cross-coupled inverters.

9. The circuitry of claim 8 wherein the SRAM access circuitry is further adapted to about simultaneously release each of the pair of cross-coupled inverters, such that the one of the portion of SRAM memory cells selects one of two stable states.

10. The circuitry of claim 8 wherein:
    during a first of the two stable states, a LOW logic level is at the input to the one of the pair of cross-coupled inverters and a HIGH logic level is at the input to the another of the pair of cross-coupled inverters; and
    during a second of the two stable states, a HIGH logic level is at the input to the one of the pair of cross-coupled inverters and a LOW logic level is at the input to the another of the pair of cross-coupled inverters.

11. The circuitry of claim 8 wherein the one of the portion of SRAM memory cells is a six transistor SRAM cell.

12. The circuitry of claim 11 wherein:
    the one of the portion of SRAM memory cells further comprises:
       one NMOS access transistor element coupled between the input to the one of the pair of cross-coupled inverters and one bitline; and
       another NMOS access transistor element coupled between the input to the another of the pair of cross-coupled inverters and another bitline;
    the one of the pair of cross-coupled inverters comprises:
       a first PMOS transistor element coupled between an SRAM memory cell power supply and the output from the one of the pair of cross-coupled inverters; and
       a first NMOS transistor element coupled between the output from the one of the pair of cross-coupled inverters and a ground; and
    the another of the pair of cross-coupled inverters comprises:
       a second PMOS transistor element coupled between the SRAM memory cell power supply and the output from the another of the pair of cross-coupled inverters; and
       a second NMOS transistor element coupled between the output from the another of the pair of cross-coupled inverters and the ground.

13. The circuitry of claim 8 wherein the one of the portion of SRAM memory cells further comprises:
    one access transistor element coupled between the input to the one of the pair of cross-coupled inverters and one bitline; and
    another access transistor element coupled between the input to the another of the pair of cross-coupled inverters and another bitline.

14. The circuitry of claim 13 wherein during the metastable state, a HIGH logic level is at the one bitline and a HIGH logic level is at the another bitline.

15. The circuitry of claim 14 wherein during the metastable state, the one access transistor element and the another access transistor element are both overdriven.

16. The circuitry of claim 14 wherein a gate of the one access transistor element and a gate of the another access transistor element are both coupled to a wordline.

17. The circuitry of claim 16 wherein during the metastable state, the one access transistor element and the another access transistor element are both overdriven, such that a voltage at the wordline is greater than a voltage of an SRAM memory cell power supply.

18. The circuitry of claim 17 wherein during the metastable state:
    the voltage at the wordline is equal to about 1.5 volts; and
    the voltage of the SRAM memory cell power supply is equal to about 1.0 volts.

19. The circuitry of claim 17 wherein during the metastable state:
the voltage at the wordline is equal to about 1.0 volts; and
the voltage of the SRAM memory cell power supply is equal to about 0.5 volts.

20. The circuitry of claim 13 wherein the one access transistor element is an NMOS transistor element and the another access transistor element is an NMOS transistor element.

21. The circuitry of claim 13 wherein during the metastable state, a LOW logic level is at the one bitline and a LOW logic level is at the another bitline.

22. The circuitry of claim 1 further comprising:
a plurality of wordlines coupled between the SRAM access circuitry and the plurality of SRAM memory cells, such that each of the portion of SRAM memory cells is coupled to a corresponding one of the plurality of wordlines;
a plurality of inverting bitlines coupled between the SRAM access circuitry and the plurality of SRAM memory cells, such that each of the portion of SRAM memory cells is coupled to a corresponding one of the plurality of inverting bitlines; and
a plurality of non-inverting bitlines coupled between the SRAM access circuitry and the plurality of SRAM memory cells, such that each of the portion of SRAM memory cells is coupled to a corresponding one of the plurality of non-inverting bitlines.

23. The circuitry of claim 22 wherein during the metastable state:
each corresponding one of the plurality of inverting bitlines is at a LOW logic level; and
each corresponding one of the plurality of non-inverting bitlines is at a LOW logic level.

24. The circuitry of claim 22 wherein during the metastable state:
each corresponding one of the plurality of inverting bitlines is at a HIGH logic level; and
each corresponding one of the plurality of non-inverting bitlines is at a HIGH logic level.

25. The circuitry of claim 24 wherein during the metastable state, each corresponding one of the plurality of wordlines is overdriven.

26. The circuitry of claim 24 wherein during the metastable state:
a voltage at each corresponding one of the plurality of wordlines is equal to about 1.5 volts; and
a voltage of an SRAM memory cell power supply is equal to about 1.0 volts.

27. The circuitry of claim 24 wherein during the metastable state:
a voltage at each corresponding one of the plurality of wordlines is equal to about 1.0 volts; and
a voltage of an SRAM memory cell power supply is equal to about 0.5 volts.

28. The circuitry of claim 1 wherein the SRAM access circuitry is further adapted to:
force at least the portion of the plurality of SRAM memory cells into an opposite metastable state;
release the portion of SRAM memory cells, such that each of the portion of SRAM memory cells selects one of two stable states; and
provide a supplemental selection profile based on which of the two stable states was selected by each of the portion of SRAM memory cells.

29. Circuitry comprising:
a plurality of static random access memory (SRAM) memory cells; and
SRAM control circuitry adapted to:
force at least a portion of the plurality of SRAM memory cells into a metastable state; and
determine a digital fingerprint of the plurality of SRAM memory cells based on a release of the portion of SRAM memory cells from the metastable state.

30. A method comprising:
forcing at least a portion of a plurality of static random access memory (SRAM) memory cells into a metastable state; and
determining a digital fingerprint of the plurality of SRAM memory cells based on a release of the portion of SRAM memory cells from the metastable state.

31. The method of claim 30 wherein:
the forcing at least the portion of the plurality of SRAM memory cells into the metastable state comprises:
driving a plurality of inverting bitlines, such that each of the plurality of inverting bitlines is at a HIGH logic level;
driving a plurality of non-inverting bitlines, such that each of the plurality of non-inverting bitlines is at a HIGH logic level; and
driving a wordline into an asserted state, such that a voltage at the wordline is greater than a voltage of an SRAM memory cell power supply; and
the determining the digital fingerprint of the plurality of SRAM memory cells based on the release of the portion of SRAM memory cells from the metastable state comprises:
releasing the portion of SRAM memory cells by driving the wordline into a de-asserted state, such that the wordline has a LOW logic level; and
performing a normal read of the portion of SRAM memory cells, such that the digital fingerprint is based on the normal read.

32. The method of claim 30 wherein:
the forcing at least the portion of the plurality of SRAM memory cells into the metastable state comprises:
driving a plurality of inverting bitlines, such that each of the plurality of inverting bitlines is at a LOW logic level;
driving a plurality of non-inverting bitlines, such that each of the plurality of non-inverting bitlines is at a LOW logic level; and
driving a wordline into an asserted state, such that the wordline is at a HIGH logic level; and
the determining the digital fingerprint of the plurality of SRAM memory cells based on the release of the portion of SRAM memory cells from the metastable state comprises:
releasing the portion of SRAM memory cells by driving the wordline into a de-asserted state, such that the wordline has a LOW logic level; and
performing a normal read of the portion of SRAM memory cells, such that the digital fingerprint is based on the normal read.

33. The method of claim 30 further comprising:
forcing at least some of the portion of the plurality of SRAM memory cells into an opposite metastable state; and
further determining the digital fingerprint of the plurality of SRAM memory cells based on a release of the some of the portion of SRAM memory cells from the opposite metastable state.

34. The method of claim 33 further comprising determining the some of the portion of SRAM memory cells based on which of the portion of the plurality of SRAM memory cells that do not reliably obtain one state with one method.

35. The method of claim 30 further comprising providing a masked digital fingerprint of the plurality of SRAM memory cells based on the digital fingerprint of the plurality of SRAM memory cells, wherein the masked digital fingerprint at least partially removes systematic mismatch.

36. The method of claim 35 wherein the masked digital fingerprint is based on inverting about one-half of bits of the digital fingerprint.

37. The method of claim 36 wherein the about one-half of the bits of the digital fingerprint are selected randomly.

\* \* \* \* \*